(12) United States Patent
Cai et al.

(10) Patent No.: US 8,714,762 B2
(45) Date of Patent: May 6, 2014

(54) LED LIGHT SOURCE AND MANUFACTURING METHOD THEREOF

(75) Inventors: Zou Cai, Guangdong (CN); Jun Zou, Guangdong (CN); Xuehua Mao, Guangdong (CN)

(73) Assignee: Zhou Cai, Shenzhen, Guangdong (CN)

( * ) Notice: Subject to any disclaimer, the term of this patent is extended or adjusted under 35 U.S.C. 154(b) by 301 days.

(21) Appl. No.: 13/068,764

(22) Filed: May 18, 2011

(65) Prior Publication Data

US 2012/0281388 A1  Nov. 8, 2012

Related U.S. Application Data

(63) Continuation-in-part of application No. 13/068,162, filed on May 3, 2011, now Pat. No. 8,534,866.

(51) Int. Cl.
*F21V 9/16* (2006.01)

(52) U.S. Cl.
USPC ........................................ 362/84; 362/217.08

(58) Field of Classification Search
USPC ................ 362/217.08, 650, 235, 249.02, 294
See application file for complete search history.

(56) References Cited

U.S. PATENT DOCUMENTS 5,949,394 A * 9/1999 Kishino et al. ............... 345/74.1

\* cited by examiner

*Primary Examiner* — David V Bruce
(74) *Attorney, Agent, or Firm* — Raymond Y. Chan; David and Raymond Patent Firm

(57) ABSTRACT

A LED light source includes one or more LED light source arrangements, wherein each of the LED light source arrangements includes a LED member having a first light emitting surface and an opposed second light emitting surface, and two fluorescent members on top of the first and second light emitting surfaces of the LED member respectively to retain the LED member in position such that the illumination generated from the LED member is capable of passing through the two fluorescent members from the two light emitting surfaces respectively. The LED light source arrangement provides illumination at an angle greater than 180° and direct effective heat dissipation at all sides of the LED member.

37 Claims, 28 Drawing Sheets

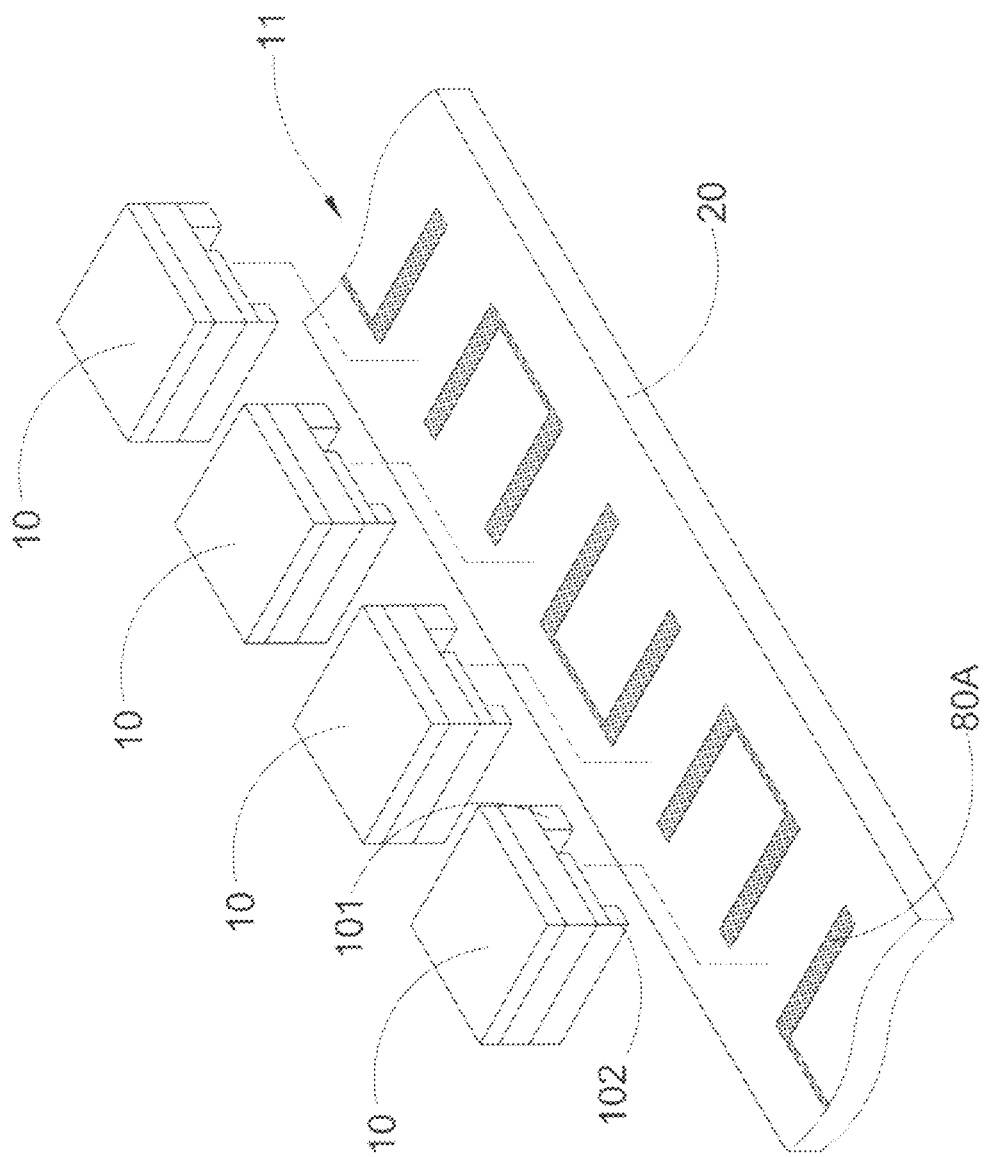

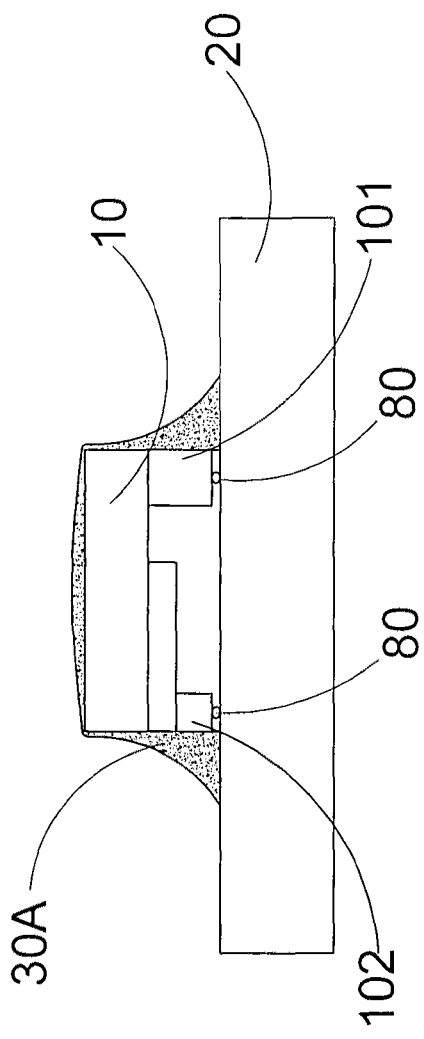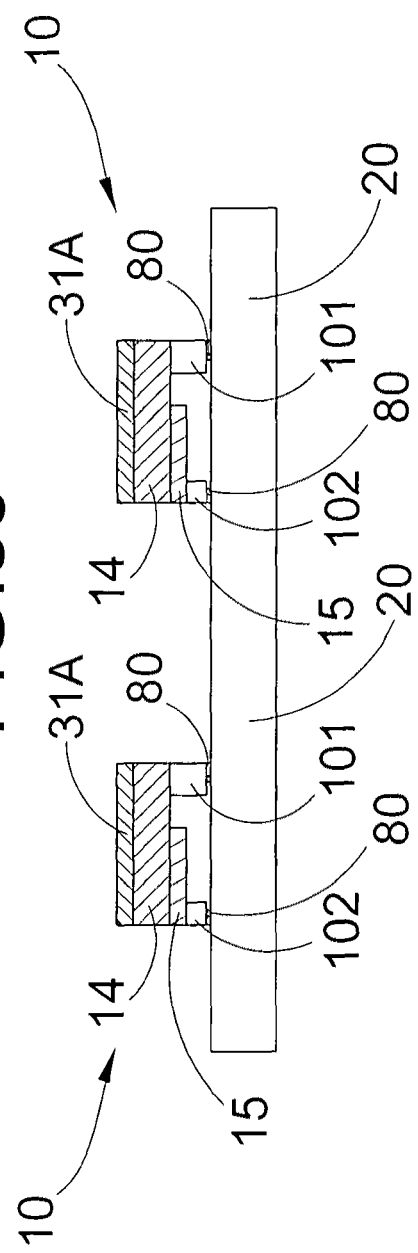

LED LIGHT SOURCE AND MANUFACTURING METHOD THEREOF

CROSS REFERENCE OF RELATED APPLICATION

This is a Continuation-In-Part application that claims the benefit of priority under 35 U.S.C.§119 to a non-provisional application, application Ser. No. 13/068,162, filed May 3, 2011 now U.S. Pat. No.8,534,866.

BACKGROUND OF THE PRESENT INVENTION

1. Field of Invention

The present invention relates to light-emitting diode (LED), and more particularly to a LED light source and manufacture method thereof, wherein the LED light source has a heat dissipation arrangement and is adapted to be embodied in a LED light bulb, providing a high intensity lighting effect, while its manufacturing method is optimized with lowered cost.

2. Description of Related Arts

The conventional LED light source requires effective heat dissipating device for heat dissipation to function effectively. Usually, the heat dissipation mechanism or arrangement involves natural heat convection, addition of cooling fan device, addition of heat pipe, construction of heat sink structure, and etc. The cooling fan device is complicated but of relative low reliability. The heat pipe has a relative low rate of heat dissipation. The heat sink structure is limited by the surface area of its fins structure. All these conventional structures fail to solve the problem of heat dissipation satisfactorily.

Conventional LED light source is a sealed structure, comprising a substrate serving as a base and a LED member having one side bonded to the substrate and another side for light emission. In addition, resin is usually used to encapsulate the LED member in such a manner that the LED member is affixed onto the substrate.

Recently, the problem of LED heat dissipation is one of the major issues in developing LED into the modern light source. The design and construction of the LED heat dissipating arrangement directly and greatly determines the lifespan, functionality and cost of the LED light source. In additional, the conventional LED light source only provides one light emitting surface while the other bonded surface is limited onto the substrate and cannot be used, resulting in a relatively low lighting intensity and efficiency. Moreover, the light beams at the bonded surface are blocked by the substrate to emit and thus converted into heat energy accumulated around the bonded surface and the substrate, creating a working environment with relatively higher temperature for the LED light source, and it is well known that the higher the working environmental temperature does reduce the efficiency of the LED light source. Therefore, the problem of the LED heat dissipation is a vicious circle of the lighting efficiency and performance of the LED light source.

SUMMARY OF THE PRESENT INVENTION

The invention is advantageous in providing a LED light source which greatly increases the lighting efficiency, decreases the design difficulty and lowers the cost of manufacture.

Another advantage of the invention is to provide a LED member which can emit lights at both sides thereof that eliminates the heat acumination at the bonded surface and the substrate of the conventional LED light source.

Another advantage of the invention is to provide a LED member which is sandwiched between two fluorescent members to define one or more passage openings through which direct that heat transfer from the LED member through the passage opening is achieved.

Another advantage of the invention is to provide a two-layered LED member which is directly bonded with two fluorescent members in a sandwich manner which defines one ore more passage openings through which direct that heat transfer from the LED member through the passage opening is achieved.

Another advantage of the invention is to provide a three-layered LED member which is sandwiched between two fluorescent members that defines one or more passage openings through which direct that heat transfer from the LED member through the passage opening is achieved.

Another advantage of the invention is to provide a LED member which is sandwiched by two fluorescent members and bonded into position to define a LED receiving cavity with one or more passage openings, that a filled gas such as an inert gas is used to fill the receiving cavity for further enhance heat dissipation.

Another advantage of the invention is to provide a LED light bulb including a shell body defining a shell cavity which is filled with an inert gas to receive and communicate with at least one LED member or LED light source arrangement in such a manner that heat dissipation through the entire shell body is made possible.

Another advantage of the invention is to provide a LED light bulb including a shell body defining a shell cavity which is filled with an inert gas to receive and communicate with at least one LED member or LED light source arrangement, wherein each LED member or LED light source arrangement is connected to or supported through a head portion of the shell body through a connector of a light effect construction in such a manner that the illumination generated by the LED member or LED light source arrangement inside the shell cavity can reach the entire illuminative surface of the shell body.

Additional advantages and features of the invention will become apparent from the description which follows, and may be realized by means of the instrumentalities and combinations particular point out in the appended claims.

According to the present invention, the foregoing and other objects and advantages are attained by a LED light bulb which comprises a shell body defining a shell cavity containing a filled gas and an illumination surface, comprising:

a LED light source arrangement received inside the shell cavity and supported though a head portion of the shell body for providing illumination, wherein the LED light source arrangement comprises:

at least one LED member in which each the LED member comprising a first and a second light emitting surface adapted for providing illumination through electroluminescence;

two fluorescent members sandwiching the LED member in such a manner that one the light emitting surface is biased against one the fluorescent member directly for support and direct heat transfer while the illumination generated from the LED member is capable of passing through the two light emitting surfaces to the two fluorescent members respectively;

an electrode member comprising two ends electrically connected to two opposite ends of the LED member respectively adapted for connecting to a power source through the head portion of the shell body; and a connecting member connecting the two fluorescent members into position in such a manner that a LED receiving cavity is defined and a connecting distance between the two fluorescent members are fixed such that the LED member is biased into positioned between the two fluorescent members in the LED receiving cavity and the two ends of the electrode member are extended outwardly to connect to the head portion of the shell body, wherein the connecting member further defines one or more passage openings between the two fluorescent members for the LED member to communicate outside the receiving cavity with the shell cavity such that the filled gas serves as an medium for direct heat transfer away from the LED member through the passage openings to the shell cavity and then to the entire body of the shell body for effective heat dissipation.

In accordance with another aspect of the invention, the present invention a LED light source arrangement, comprising:

at least one LED member in which each the LED member comprising a first and a second light emitting surface adapted for providing illumination through electroluminescence;

two fluorescent members on two sides of the LED member respectively such that the illumination generated from the LED member is capable of passing through the two light emitting surfaces to the two fluorescent members respectively;

an electrode member comprising two ends electrically connected to a p-type and a n-type doping units of the LED member respectively, adapted for connecting to a power source; and a connecting member connecting the two fluorescent members into position in such a manner that a LED receiving cavity is defined and a connecting distance between the two fluorescent members are fixed such that the LED member is positioned between the two fluorescent members in the LED receiving cavity and the two ends of the electrode member are extended outward the receiving cavity, wherein the connecting member comprises:

a pair of position members clipping the two fluorescent members at two ends respectively in such a manner that the connecting distance between the two fluorescent members is greater than a thickness of the LED member for providing a surface heat passage between each of the light emitting surfaces and each corresponding the fluorescent member through the difference between the connecting distance and the thickness of the LED member; and two LED arm members connected to two lateral sides of the LED member respectively for supporting the LED member to suspend between the two fluorescent members inside the LED receiving cavity, thereby direct heat transfer away from the LED member through the two sides of the LED member and the two fluorescent members is attained.

In accordance with another aspect of the invention, the present invention comprises a manufacturing method of a LED light source for providing illumination, comprising the steps of:

(a) overlapping a first current dispersion layer and a second illuminative layer horizontally;

(b) forming a LED-layered unit which defines two light emitting surfaces through doping the LED-layered unit to form a p-type doping unit on the current dispersion layer and a n-type doping unit on the illuminative layer such that a p-n junction is defined between said two layers at which electroluminescence is arranged to occurred;

(c) sandwiching the plurality of LED-layered units with two fluorescent members such that the two light emitting surfaces of the LED-layered units are biased against said two fluorescent members directly for support and direct heat transfer;

(d) providing an electrode member connected to each of the LED-layered unit, adapted for connecting the LED-layered unit to a power source;

(e) forming a LED light source arrangement by sealing the two fluorescent members with a connecting member to define a LED receiving cavity for receiving one or more LED-layered unit in such a manner that one or more passage openings is defined between the LED receiving cavity and an external environment outside the receiving cavity such that direct heat transfer away from the LED-layered unit through the passage openings is attained;

(f) forming a LED light bulb by connecting the electrode member to a head portion of a shell body and supporting the LED light source arrangement through the head portion of the shell body such that the LED light source arrangement is received inside a shell cavity filled with a filled gas, whereby the filled gas is served as a medium for heat transfer, adapted for guiding the heat generated from the LED light source arrangement to reach the shell body; and (g) providing a light effect construction which comprises one or more connector, each for connecting one of the LED light source arrangements to the head portion of the shell body so as to position the LED light source arrangements at an optimized position inside the shell cavity in such a manner that the illumination generated from the LED light source arrangement is capable of reaching an illuminative surface of the shell body in entirely.

In the step (a), the manufacturing method further comprises a step of optionally bonding a third base layer to the illuminative layer.

In the step (b), the manufacturing method further comprises a step of forming a plurality of LED-layered unit by repeating the above steps.

In the step (e), the manufacturing method further comprises a step of optionally forming a plurality of LED light source arrangement by repeating the above steps after step (e).

According to the above manufacturing method, the step (f) can be substituted by the step of forming a LED light bulb by connecting a plurality of LED light source arrangements to a head portion of a shell body in which the electrode member of each LED light source arrangement is connected to the head portion of the shell body through which the LED light source arrangements are supported, and that the LED light source arrangements are received inside a shell cavity of the shell body which is filled with a filled gas, whereby the filled gas is served as a medium for heat transfer, adapted for guiding the heat generated from the LED light source arrangements to reach the shell body.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 29A is exploded view illustrating the printed circuit layer of the electric conductive layer formed on the fluorescent member according to the above preferred embodiment of the present invention.

FIG. 35 is a side view illustrating a second alternative mode of the fluorescent layer according to the above preferred embodiment of the present invention.

FIG. 36 is a sectional view illustrating a third alternative mode of the fluorescent layer according to the above preferred embodiment of the present invention.

DETAILED DESCRIPTION OF THE PREFERRED EMBODIMENT

Figure 1:
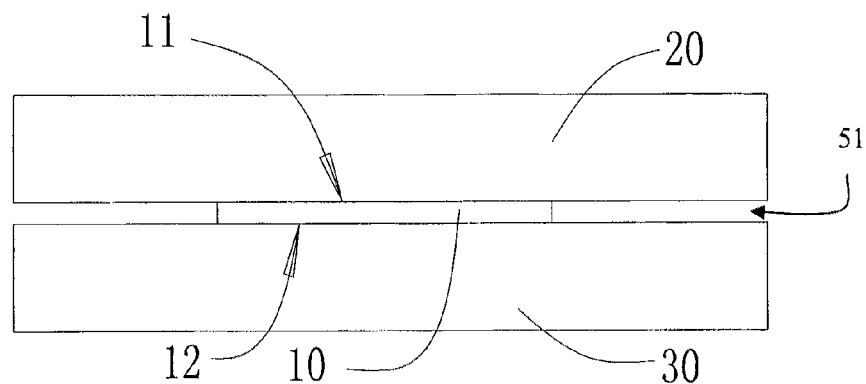
FIG. 1 is a cross-section view illustrating a LED light source according to a preferred embodiment of the present invention.

Referring to FIGS. 1 to 3, 16 and 17 of the drawings, a light-emitting diode (LED) light source according to a preferred embodiment of the present invention is illustrated, wherein the LED light source comprises one or more LED light source arrangements 100 adapted for electrically connecting to a power source and a retention member 5. Each of the LED light source arrangements 100 comprises at least a LED member having first and second light emitting surfaces 11, 12 adapted for electrically connecting to the power source, and first and second fluorescent members 20, 30 provided on the first and second light emitting surfaces 11, 12 respectively, wherein the retention member 5 connects the two fluorescent members 20, 30 in position.

In particular, referring to FIGS. 2 to 5, the light emitting surfaces 11, 12 of the LED member 10 of each of the LED light source arrangements 100 are adapted for providing illumination through electroluminescence. The LED member 10 is positioned between the two fluorescent members 20, 30. In particular, the LED member 10 is sandwiched between the two fluorescent members 20, 30 at a position that each of the light emitting surfaces 11, 12 is biased against the corresponding fluorescent member 20, 30 directly for supporting and directing heat transfer while the illumination generated from the LED member 10 is capable of passing through the two light emitting surfaces 11, 12 to the two fluorescent members 20, 30 respectively. Accordingly, the LED member 10 is electrically connected to the power source via an electrical connection arrangement. The electrical connection arrangement comprises an electrode member 81 having two ends electrically connected to two opposite ends of the LED member 10 respectively for electrically connecting to the power source.

The retention member 5 is coupled with the two fluorescent members 20, 30 to retain the fluorescent members 20, 30 in position to define a LED receiving cavity 51 between the inner surfaces of the fluorescent members 20, 30 so as to receive the LED member 10 within the LED receiving cavity 51. Accordingly, the retention member 5 is coupled at the peripheral edges of the fluorescent members 20, 30 to retain the fluorescent members 20, 30 in position.

In addition, when the fluorescent members 20, 30 are retained by the retention member 5, a gap between the two fluorescent members 20, 30, i.e. the width of the LED receiving cavity 51, is fixed such that the LED member 10 is held between the two fluorescent members in the LED receiving cavity 51 and the two ends of the electrode member 81 are extended outwardly outside the LED receiving cavity 51.

Figure 3:
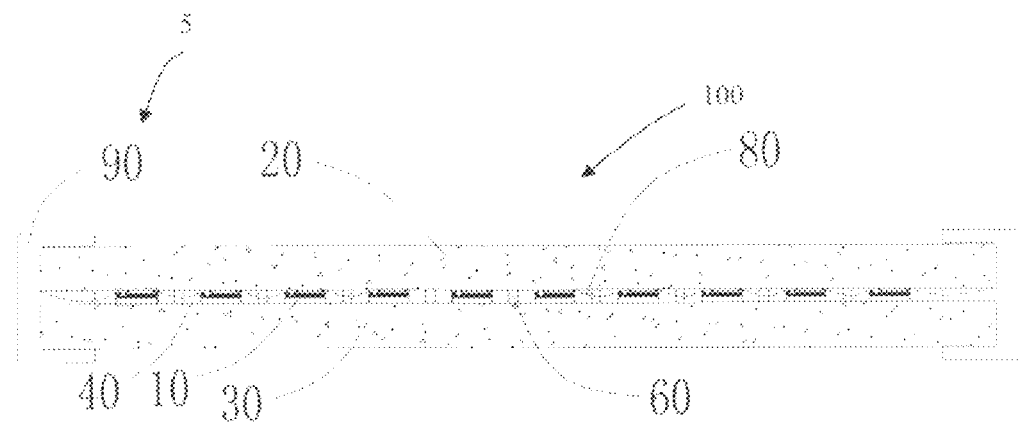
FIG. 3 is an A-A cross-section view illustrating an alternative mode of the LED light source of FIG. 2 according to the above preferred embodiment of the present invention.

The retention member 5, which is an edge holder, may be embodied to have a C-shaped cross section to define two horizontal portions and a vertical portion extending therebetween, wherein the two horizontal portions of the retention member 5 couple with two outer sides of the fluorescent members 20, 30 respectively at the peripheral edges thereof. Preferably, the retention member 5 has a E-shaped cross section to define three horizontal portion and a vertical portion extending therefrom, wherein two horizontal portions of the E-shaped retention member 5 couple with two outer sides of the fluorescent members 20, 30 respectively at the peripheral edges thereof while the middle horizontal portion of the E-shaped retention member 5 is extended into the LED receiving cavity 51 to further retain the width of the LED receiving cavity 51 as shown in FIG. 3.

The retention member 5 further has one or more passage openings 70 between the two fluorescent members 20, 30 for the LED member 10 to communicate with an external environment outside the LED receiving cavity 51 such that direct heat transfer away from the LED member 10 through the passage openings 70 is attained.

It is worth mentioning that the LED member 10 provides two light emitting surfaces 11, 12, wherein each of which is coupled with one of the fluorescent members 20, 30 such that two illuminative surfaces are provided by one LED member 10. Therefore, the lighting efficiency is increased by at least 30%. Furthermore, the LED member 10 is not affixed on a base or a heat sink, which is usually a metal base, therefore making it possible for the LED member 10 to provide two exposable ends, instead of one, for heat dissipation through convection and radiation. Therefore, it is possible to simplify the construction of heat dissipation arrangement for the LED member 10. In other words, compared to the convention LED light source in which one side of the LED is blocked by a base or a heat sink, the LED member 10 of the present invention provides illumination at a wider angle, that the LED member 10 of the present invention is capable of providing illumination at an angle greater than 180° at each of the light emitting surfaces 11, 12.

Preferably, the first fluorescent member 20 is a fluorescent chip which can be a glass or crystal chip or a transparent ceramics chip, and the second fluorescent member 30 is a fluorescent colloid and vice versa. Alternately, both the first fluorescent member 20 and the second fluorescent member 30 can be fluorescent chips or fluorescent colloids.

In other words, each of the first and second fluorescent members 20, 30 can be selected from a group consisting of fluorescent chip and fluorescent colloid.

In particular, the fluorescent chip of one of the fluorescent members 20 (30) is arranged to form a base of the LED member 10, which is also capable of transferring heat for dissipating the heat away from the LED member 10. Since the fluorescent chip of the fluorescent member 20 (30) has a thickness which is significant smaller than that of a conventional base structure for LED light source, the effectiveness of the heat transfer is greatly increased. The fluorescent chip can be made of fluorescent glass or crystal or a type of transparent ceramics, or made of a glass or crystal chip or a transparent ceramic chip coated with fluorescent powder. Preferably, the fluorescent chip is made of Yttrium Aluminum Garnet (YAG) doped with rare Earth elements.

Figure 2:
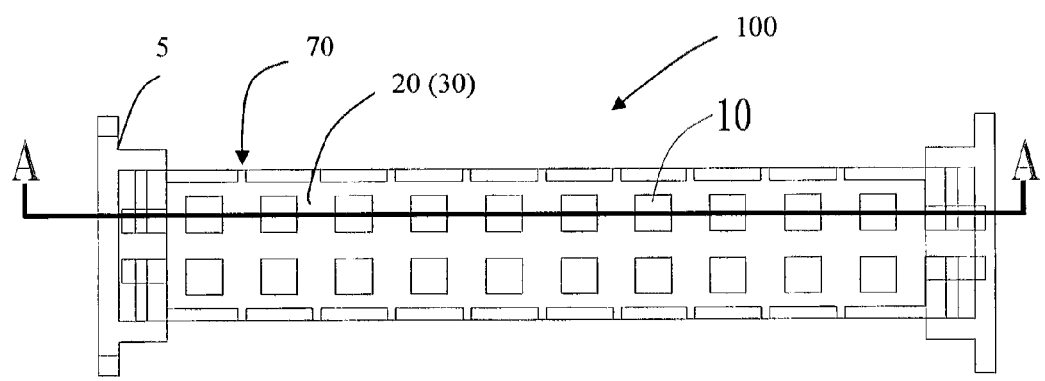
FIG. 2 is a top view illustrating an alternative mode of the LED light source according to the above preferred embodiment of the present invention.

Referring to FIGS. 2 and 3 of the drawings, the LED members 10 are spacedly and alignedly sandwiched between the fluorescent members 20, 30, wherein fluorescent chips are used for both the first fluorescent member 20 and the second fluorescent member 30. In particular, the LED members 10 are electrically connected in parallel or in series, sandwiched between the two fluorescent members 20 and are horizontally and spaciously aligned in such a manner that a heat passage 40 is defined between two adjacent LED members 10 for heat dissipation.

It is worth mentioning that the fluorescent chip which has a rigid body forms a rigid support of the LED members 10, that the conventional support base (usually metal base, such as brass) of LED light source is eliminated, such that the lighting efficiency is increased while the overall size is reduced. The heat passage 40, which is provided between two adjacently positioned LED members, provides an effective and direct means for heat transfer away from the LED members 10. In the absence of resin-like materials encapsulating the LED members, together with the provision of heat passages 40, the heat dissipation can be effectively achieved, hence ensuring the proper functioning of the LED members 10 under a controlled and lowered temperature and increasing the lifespan.

Figure 4:
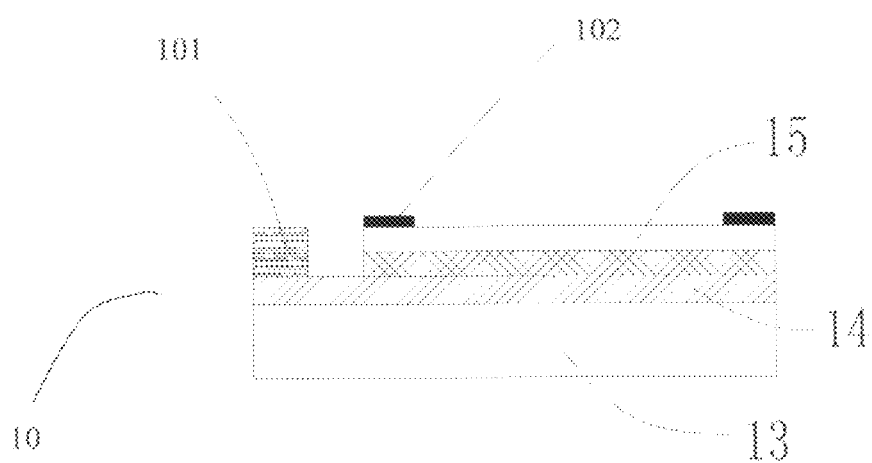
FIG. 4 is a cross-section illustration a LED member of the LED light source of the above preferred embodiment of the present invention.

Referring to FIGS. 2, 3 and 4 of the drawings, two fluorescent chips are used for the first fluorescent member 20 and the second fluorescent member 30 respectively, which are positioned in parallel to sandwich the LED members 10. In particular, each of the LED members 10 has a flip-chip construction having six illuminative facets, and comprises a plurality of layers overlapped and arrayed in order, which are a rigid and transparent base layer 13, an illuminative layer 14 and a current dispersion layer 15 overlapped and arrayed in sequence as shown in FIG. 4, wherein one of the fluorescent members 30 is coupled with the base layer 13 and the other fluorescent member 20 is connected to the current dispersion layer 15. Accordingly, the flip chip construction of the LED member 10, which is simple in construction, is capable of providing two illuminative surfaces.

Preferably, the base layer 13 is made of sapphire, which is secured onto the fluorescent member 20 (30) into position through bonding, that the bonding is preferably a molecular bonding. Accordingly, the use of molecular bonding eliminates the need of conductive medium such as silica gel for heat transfer that is limited by the maximum heat transfer capacity of the conductive medium, thereby the present invention greatly increases the capacity of heat transfer and the effectiveness of heat dissipation for the LED members 10. It is worth mentioning that the base layer 13 can also be made of other materials provided that the base layer 13 is capable of being securely bonded onto the fluorescent member 20 (30), e.g. LiALCO₃.

Alternately, the base layer 13 can also be eliminated and the LED member 10 is bonded onto the fluorescent member 20 (30) at one end. For example, the LED member 10 can be bonded onto the fluorescent member 20 (30) at one end which is free from any electrodes such that the LED member 10 without any base layer 13 being bonded onto the fluorescent member 20 (30) directly, hence greatly increasing the heat transfer away from the LED member 10.

Figure 5:
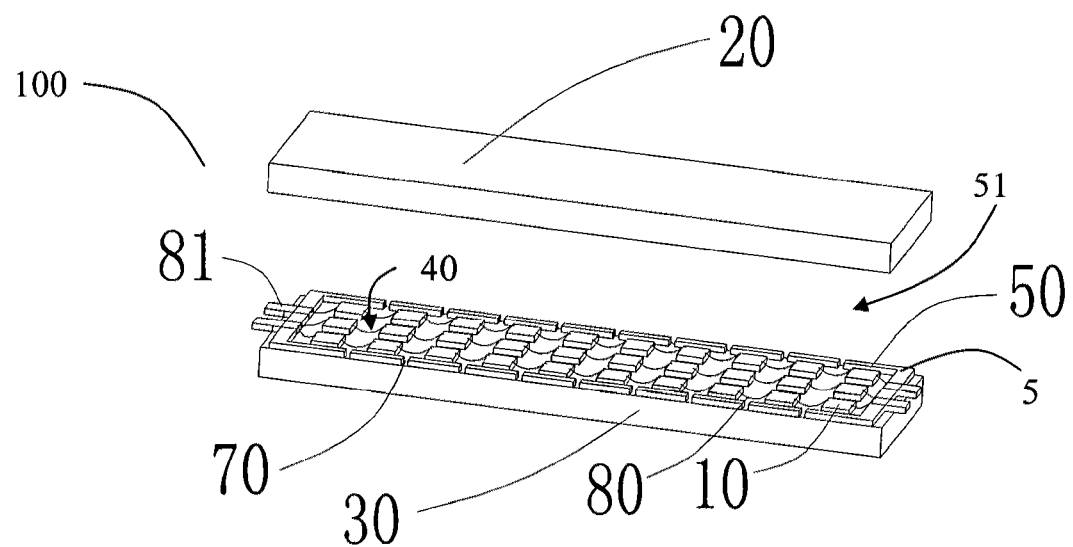
FIG. 5 is a partially explored view illustrating a construction relationship between a LED member and two fluorescent members of the LED light source according to the above preferred embodiment of the present invention.

Referring to FIGS. 3 and 5 of the drawings, the LED members 10 are provided for providing illumination effect, wherein the two fluorescent member 20, 30 sandwiches the LED members 10 in such a manner that the LED members 10 are aligned and positioned orderly between the two fluorescent members 20, 30 to define the heat passage 40 between two opposite sides of two adjacently positioned LED members 10 respectively. The retention member 5 can alternatively be an adhesive member or a bonding member 50 sealing between the two fluorescent members 20, 30 at the inner peripheral edges of the fluorescent members 20, 30 in such a manner that the bonding member 50 is peripherally sealing at the peripheral edges of the fluorescent members 20, 30 to retain the LED members 10 between the fluorescent members 20, 30. A plurality of passage openings 70 are spacedly formed along the bonding member 50 for allowing heat transfer away from the LED members 10 within the LED receiving cavity 51 through the heat passages 40 and the passage openings 70. A plurality of support members 60 are orderly and systematically provided between every two adjacent LED members 10 within the heat passage 40 for securing the relative position of each two LED members 10 and for retaining the distance of the LED receiving cavity 51 between the two fluorescent members 20, 30. Preferably, an inert gas such as helium and nitrogen having high heat conductivity is used to fill the space of the LED receiving cavity 51 between the two fluorescent members 20, 30 for further enhancing the heat transfer for directing the heat away from the LED members 10.

It is worth mentioning that the LED members 10 are sandwiched by the two fluorescent members 20, 30 and has a boundary formed by the bonding member 50, that the heat dissipation is effectively achieved by the provision of passage openings 70 opened through the heat passages 40.

Preferably, the bonding member 50 is a silica gel which is reflective and comprises an electrode member 81, the current dispersion layer 15 includes a p-type doping unit 102, the illuminative layer 14 includes a n-type doping unit 101 at a side proximal to the current dispersion layer 15, the LED members 10 are electrically connected in series or in parallel and the LED members 10 are electrical connected to the electrode member 81 through a connecting element 80 such as a gold wire, a copper wire, a printed wire printed on at least one of the fluorescent members 20, 30 with conductive material, and etc.. In particular, each two LED members 10 are electrically connected through the connecting element 80 which connects the p-type doping unit 102 and the n-type doping unit 101 of the two adjacently positioned LED members 10, and the LED member 10 which is positioned at an distal end are connected to the electrode member 81.

Alternately, the retention member 5 of the LED light source comprises two position members 90 at two distal ends clipping the two fluorescent members 20, 30 in position, as shown in FIG. 3. The use of position members 90, instead of the bonding member 50 as described above, allows direct contact of the LED members 10 to the two fluorescent members 20, 30, further optimizes the heat dissipation for the LED members 10.

Figure 16:
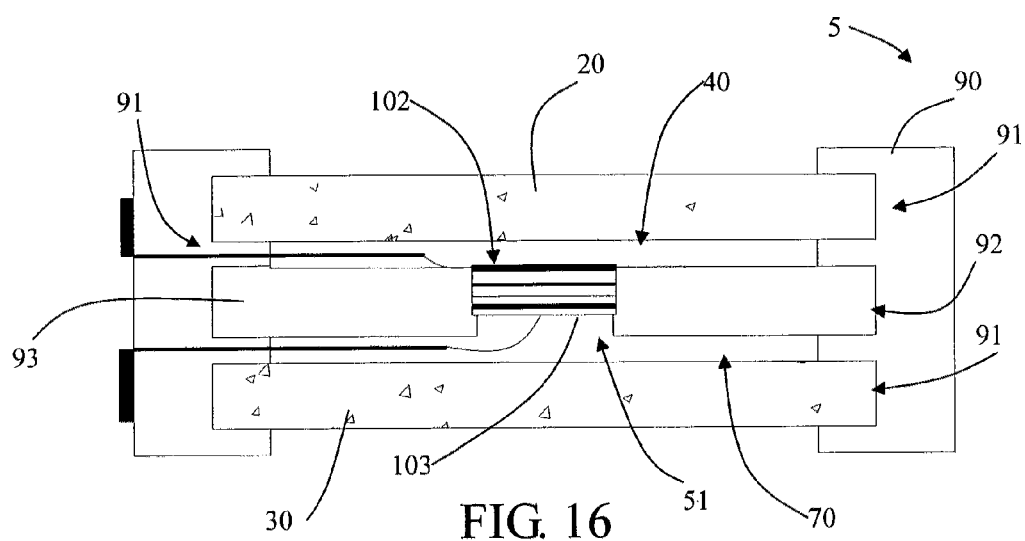
FIG. 16 is a cross-sectional view illustrating another alternative mode of the LED light source according to the above preferred embodiment of the present invention.

It is worth mentioning that an alternative mode of the LED member has a non flip-chip construction, which is a standard construction, in which a p-type doping unit 102 and a n-type doping unit 101 are positioned at two opposite facets of the LED member 10. Referring to FIG. 16 of the drawings, the LED arrangement 100 comprises a LED member 10 having two light emitting surfaces 11, 12 adapted providing illumination through electroluminescence, and two fluorescent members 20, 30 sandwiching the LED member 10 in such a manner that one of the light emitting surfaces 11 (12) is facing against one corresponding fluorescent member 20 (30) so that the illumination generated from the LED member 10 is capable of passing through the two light emitting surfaces 11, 12 to the two fluorescent members 20, 30 respectively. In other words, the p-type doping unit 102 and the n-type doping unit 101 are located at the light emitting surfaces 11, 12 of the LED member 10 respectively.

The electrode member 81 comprises two ends electrically connected to two opposite sides of the LED member 10 respectively adapted for connecting to a power source. The retention member 5 electrically connects with the LED member 10 and the two fluorescent members 20, 30 into position in such a manner that the LED receiving cavity 51 is defined and the distance between the two fluorescent members 20, 30 with respect to the LED member 10 are fixed such that the LED member 10 is suspended between the two fluorescent members 20, 30 in the LED receiving cavity 51 and the two ends of the electrode member 81 are extended outwardly outside the LED receiving cavity 51, wherein the retention member 5 further has one or more passage openings 70 between the two fluorescent members 20, 30 for the LED member 10 to communicate with an external environment outside the receiving cavity 51 such that direct heat transfer away from the LED member 10 through the passage openings is attained.

Figure 17:
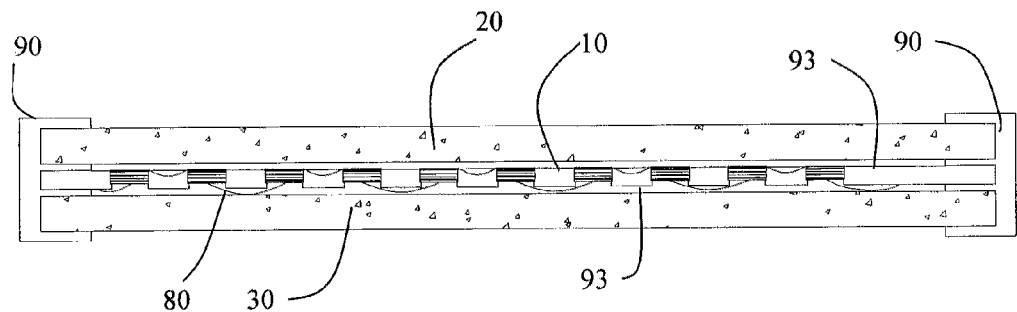
FIG. 17 is a cross-sectional view illustrating another alternative mode of the LED light source according to the above preferred embodiment of the present invention.

Preferably, the retention member 5 comprises two position members 90 at two distal ends clipping the LED member 10 and the two fluorescent members 20, 30 in position in such a manner that the LED member 10 is suspended between the two fluorescent members 90 and is supported to position through the two position members 90. In particular, as shown in FIGS. 16 and 17 of the drawings, the retention member 5 comprising two position members 90, each having two side receiving slots 91 longitudinally extended along two ends of the position member 90 and one middle receiving slot 92 between said two side receiving slots 91 and two LED arm members 93, each having a first end fitting into the middle receiving slot 91 of the corresponding position member 90 and a second end connecting to a lateral end of the LED member 10. In other words, the two position members 90 has provides two sets of receiving slots 91, 92 on each position members 90, which are preferably spaciously aligned in parallel with respect to each other, wherein the two side receiving slots 91 of each position member 90 are sized to fit and receive one end of the two fluorescent members 20, 30 and the middle receiving slot 91 is sized to fit and receive the LED arm members 93. Accordingly, the two fluorescent members 20, 30 are secured into position through the side receiving slots 91 of the two position members 90 respectively to define a receiving cavity 51 and a connecting distance between the two fluorescent members 20, 30, such that the LED member 10, having a thickness smaller than that of the connecting distance, is positioned in the receiving cavity 51 and is supported through the LED arm members 93 to suspending between the two fluorescent members 20, 30 and further defining a heat passage 40 between each fluorescent member 20, 30 and the LED member 10 for effective and direct heat transfer though the heat passage 40 and the fluorescent members on both of the two sides of the LED member 10.

Referring to FIG. 17 of the drawings, when a plurality of standard construction LED members 10 are included in the LED arrangement 100, the LED members 10 are supported through a plurality of LED arm members 93 and interconnected through a plurality of connecting elements 80. In other words, each LED member 10 are supported at two lateral ends through two LED arm members 93 respectively, through which one LED member 10 is interconnecting to another LED member 10 and the two LED members 10 at the two distal ends of the LED arrangement 100 is connecting to the position members 90 respectively. On the other hand, each two LED members 10 are interconnected through one connecting element 80.

It is worth mentioning that the LED light source of the present invention provides an effective heat dissipation for the LED member 10 or the LED members 10 under flip-chip construction or standard construction (non flip-chip construction) and is suitable to construct and arrange for different uses, for examples, light bulb, emergency light, PAR light, automotive light, street lighting, subway lighting, indoor lighting, table or desk lamp, hanging lamp, candle lamp, and etc. When the LED light source of the present invention is constructed into a LED light bulb, the flip-chip construction LED arrangement and the standard construction LED arrangement are interchangeable and replaceable without departure from the spirit of the present invention.

Figure 6:
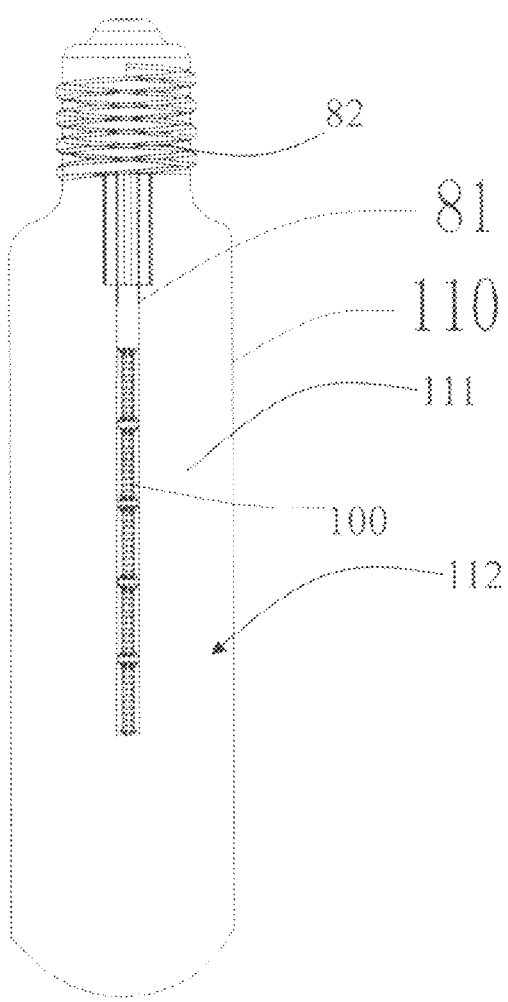
FIG. 6 is a side view illustrating another alternative mode of the LED light source according to the above preferred embodiment of the present invention.

Referring to FIG. 6 of the drawings, the LED light source of the present invention is constructed into a LED light bulb structure comprising a shell body 110 defining a shell cavity 111 having a filled gas 112 inside the shell body 110, wherein one or more LED light source arrangements 100 are supported within the shell cavity 111 of the shell body 110 to form a LED light bulb.

Accordingly, each of the LED members 10 is adapted for generating light within the shell cavity 111 to penetrate through the shell body 110. In addition, the electrode member 81 is electrically connected between the LED member 10 and the light bulb adapter 82 for providing a power source to the LED member 10 through the electrode member 81. Accordingly, heat dissipation can be achieved through the provision of passage openings 70 to direct the heat from the LED member 10 to the shell cavity 111 of the shell body 110.

Figure 6A:
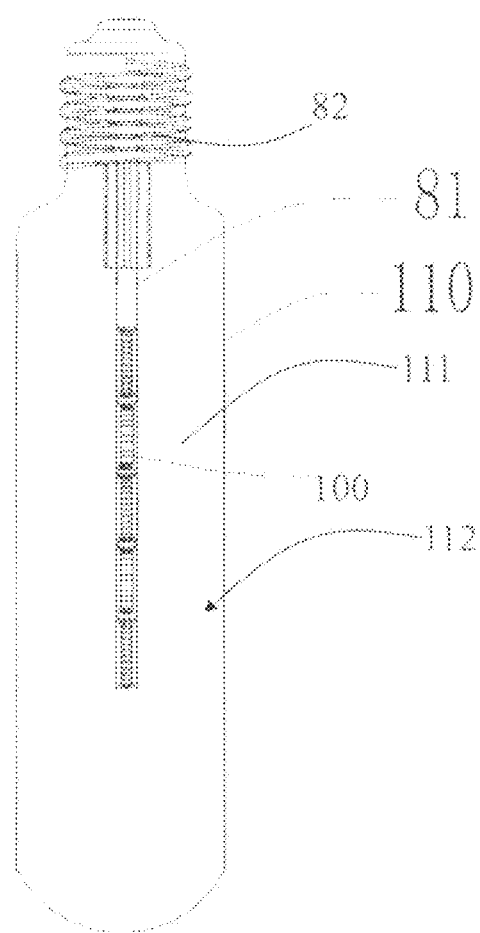
FIG. 6A is a side view illustrating an alternative mode of the LED light source as shown in FIG. 6 according to the above preferred embodiment of the present invention.

As shown in FIG. 6, the LED members 10 are aligned end-to-end to form an elongated structure, wherein the LED members 10 are configured to have the same orientation such that the LED members 10 will generate light at two sides thereof. Alternatively, as shown in FIG. 6A, the LED members 10 are aligned end-to-end to form an elongated structure, wherein the LED members 10 are configured to have different orientation such that the LED members 10 will generate light at different directions. As shown in FIG. 6A, some LED members 10 have a light orientation that generate light at front and rear directions and some LED members 10 have a light orientation that generate light at left and right directions.

Therefore, the LED members 10 are oriented alternately to provide a 360 degrees light emission for the LED light source arrangement 100.

Accordingly, the filled gas 112, which can be an inert gas, is acted as an intermediate between the LED member 10 and the shell body 110 in such a manner that all the surface area of the shell body 110 can be used for heat dissipation. Preferably, the filled gas 112 is polydimethylsiloxane (silicone oil). As a result, the surface area available for heat dissipation is greatly increased, hence increasing the efficiency of heat dissipation. Meanwhile, the filled gas 112 is an inert gas surrounding the LED member 10, which is sealed inside the shell cavity 111 of the shell body 110, thereby the LED member 10 is further protected against oxidation inside the shell cavity 111 filled with the inert gas with longer lifespan and higher reliability.

Figure 7:
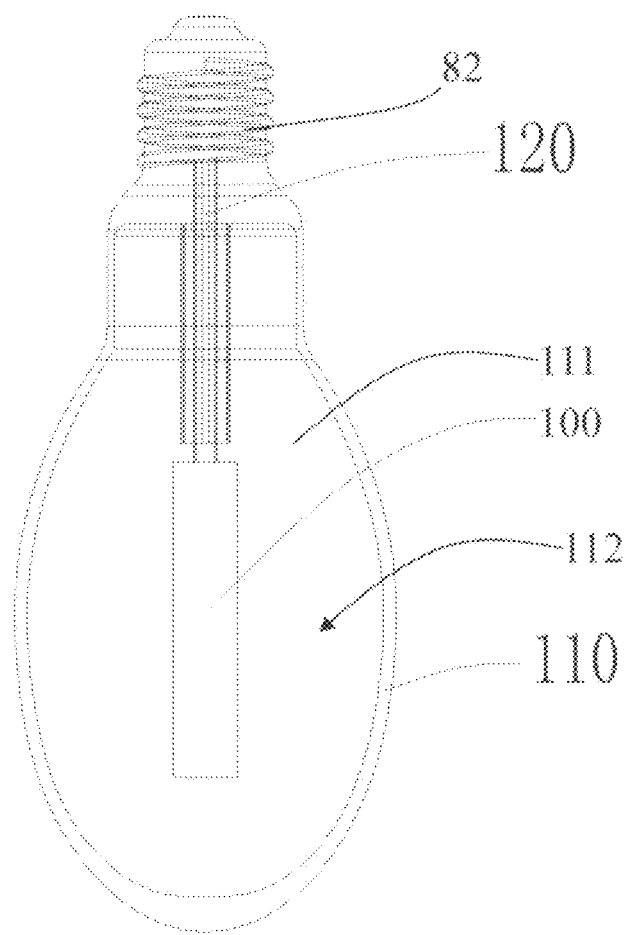
FIG. 7 is a side view illustrating another alternative mode of the LED light source according to the above preferred embodiment of the present invention.
Figure 8:
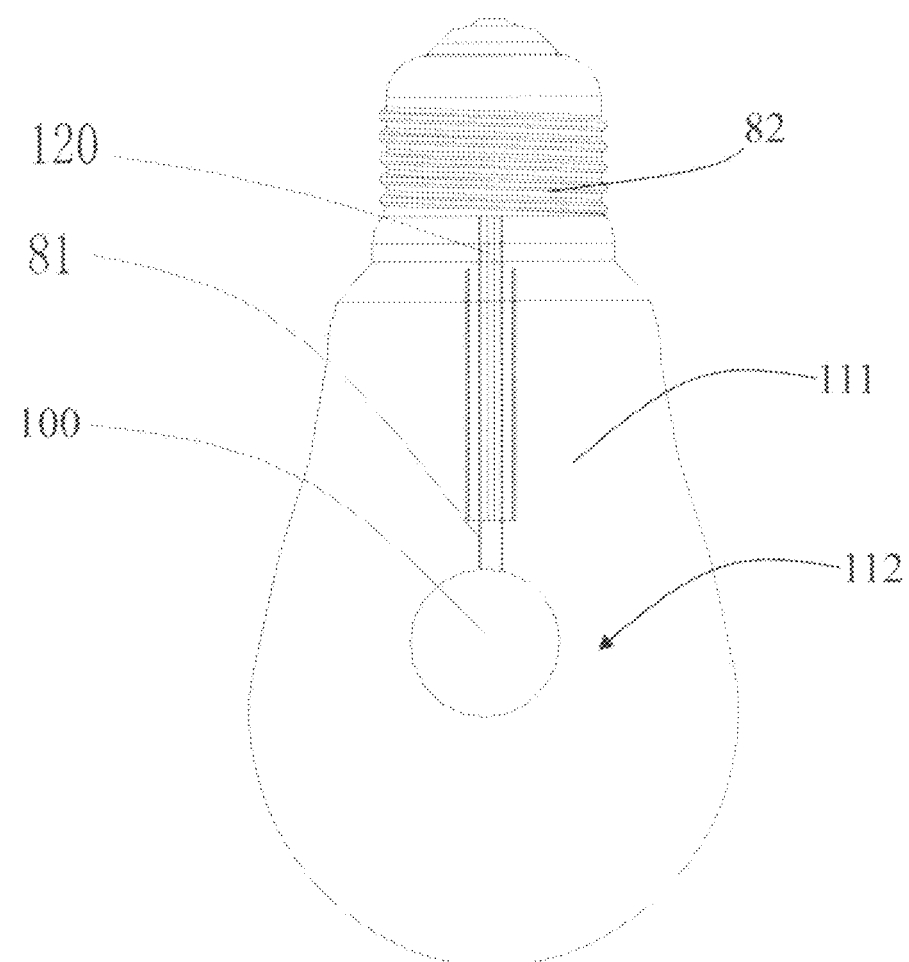
FIG. 8 is a side view illustrating another alternative mode of the LED light source according to the above preferred embodiment of the present invention.
Figure 9:
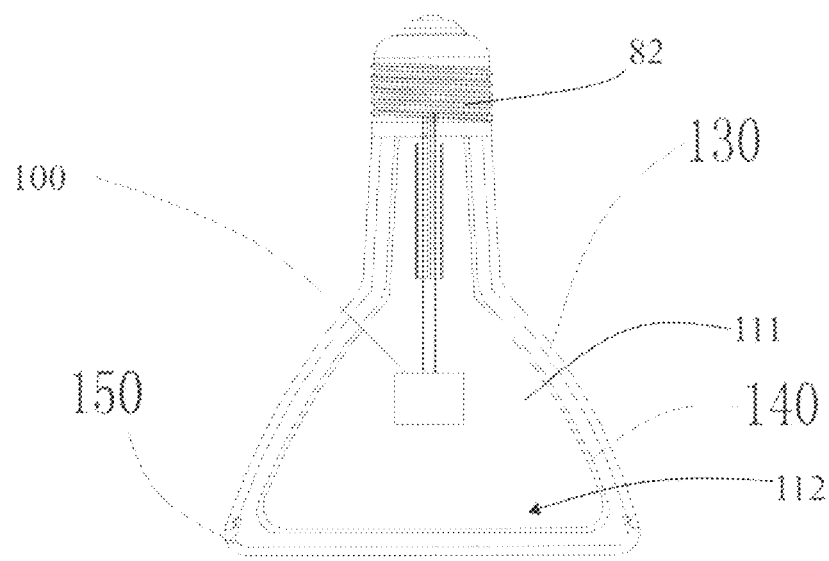
FIG. 9 is a side view illustrating another alternative mode of the LED light source according to the above preferred embodiment of the present invention.
Figure 10:
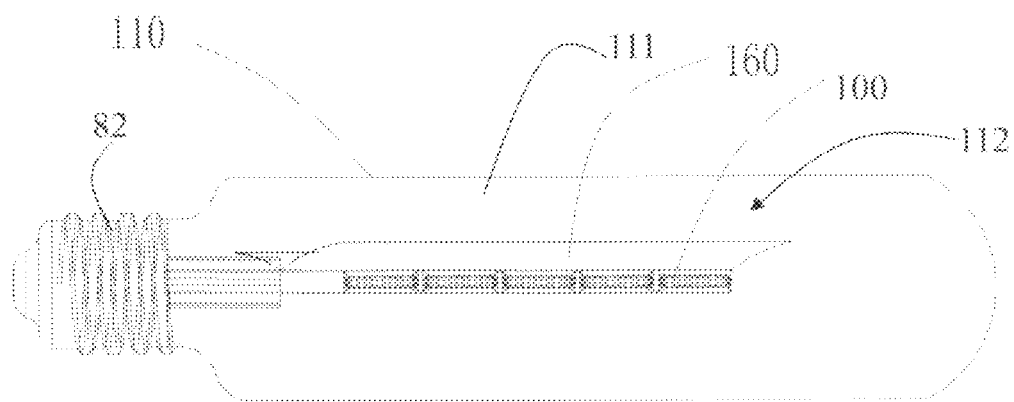
FIG. 10 is a side view illustrating another alternative mode of the LED light source according to the above preferred embodiment of the present invention.
Figure 11:
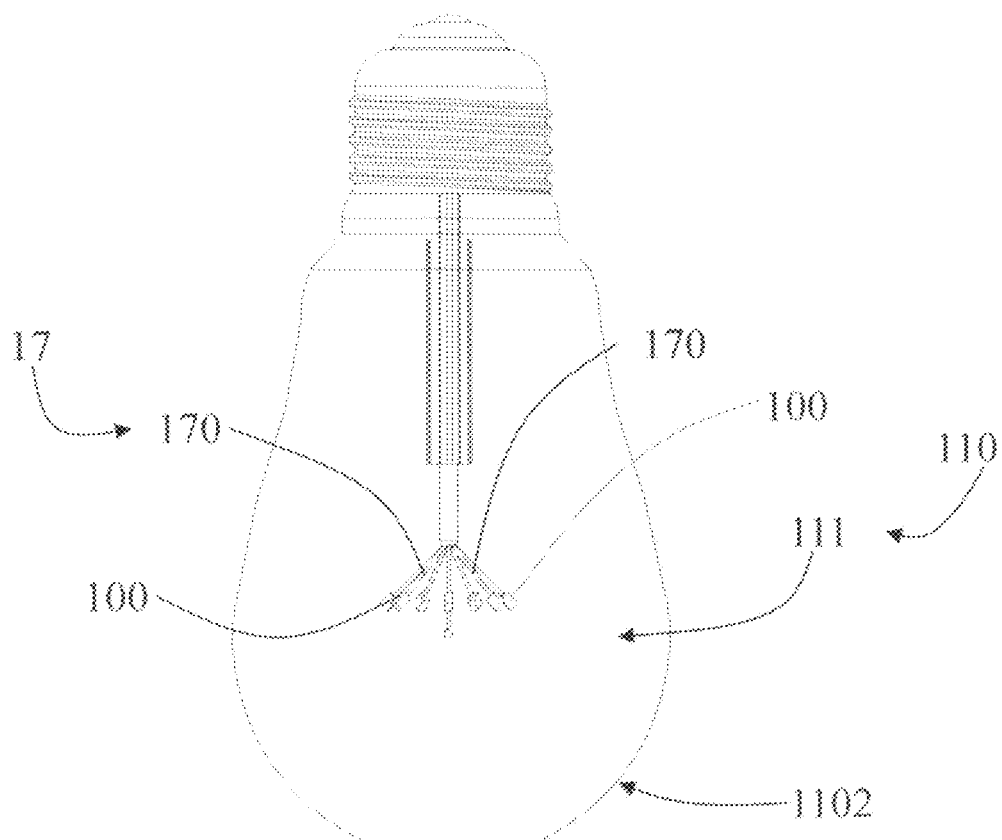
FIG. 11 is a side view illustration of another alternative of the LED light source of the above preferred embodiment of the present invention.

Preferably, the LED light source arrangement 100 may further comprise a conduit 120 connecting the fluorescent members 20, 30 to the light bulb adapter 82 of the shell body 110, as shown in FIGS. 7 and 8 of the drawings. It is worth mentioning that the size and shape of the shell body 110 can be selectively configured as shown in FIGS. 6 to 11. The shell body 110 can be formed in an elongated configuration as shown in FIGS. 6 and 10, in an oval configuration as shown in FIG. 7, in a conventional light bulb configuration as shown in FIGS. 8 and 11, or in a flask configuration as shown in FIG. 9.

Referring to FIG. 9 of the drawings, the LED light source of the present invention is constructed into a PAR light bulb. In particular, the PAR light bulb comprises a double-layered body defining a first body layer 130 as the outer layer and a second body layer 140 as the inner layer, defining a layer cavity between the two layers 130, 140 and a layer opening 150 communicating the layer cavity to outside.

Preferably, the LED light source of the present invention further comprises a light reflective member 160 extended sidewardly from one of the side of one fluorescent member 20 (30) at a position spacedly extending along the LED light source arrangement 100 in such a manner that light emitted from the LED member 10 is guided through a reflective surface of the reflective member 160 to project at one direction, which is useful for providing a lighting effect at one direction. In other words, the light emitted from the LED light source is collected and reflected to a predetermined direction through the provision of light reflective member 160, as shown in FIG. 10.

Preferably, the LED light source of the present invention further comprises a light effect construction 17 which comprises one or more connector 170, wherein each connector 170 has one end connected to one LED light source arrangement 100 and another end supported by the shell body 110 of the light bulb to position the LED light source arrangement 100 at an optimized position inside the shell cavity 111 of the shell body 110.

For example, as shown in FIG. 11 of the drawings, the light effect construction 17 for supporting the LED light source arrangements 100 within the shell cavity 111 comprises a plurality of connectors 170 extending radially, each connected to one LED light source arrangement 100 at one end, which is concentrically and outwardly extended from the shell body 110 in such a manner that the LED members 10 are orderly arranged in the center of the shell cavity 111 for providing illumination effect throughout an illuminative surface 1102 of the shell body 110. It is worth mentioning that the shell body 110 also serves as a medium for heat dissipation.

In particular, as shown in FIG. 11 of the drawings, the LED light source arrangement 100 comprises one LED member 10 for providing illumination, two fluorescent members 20, 30 sandwiching the LED member 10, and a bonding member 50 bonding the LED member 10 between the two fluorescent members 20, 30 to define a plurality of passage openings 70 between the two fluorescent members 20, 30. The bonding member 50 comprises an electrode member 81 at a distal end which is arranged for electrically connecting the LED member 10 and the light bulb adapter 82 of the shell body 110, adapted for connecting to a power source.

Alternately, the LED light source arrangement 100 comprises a plurality of LED member 10 connected in series or in parallel for providing illumination, two fluorescent members 20, 30 sandwiching the LED member 10, and a bonding member 50 bonding the LED member 10 between the two fluorescent members 20, 30 to define a plurality of passage openings 70 between the two fluorescent members 20, 30. The bonding member 50 comprises an electrode member 81 at a distal end which is arranged for electrically connecting the LED members 10 to a power source.

Figure 12:
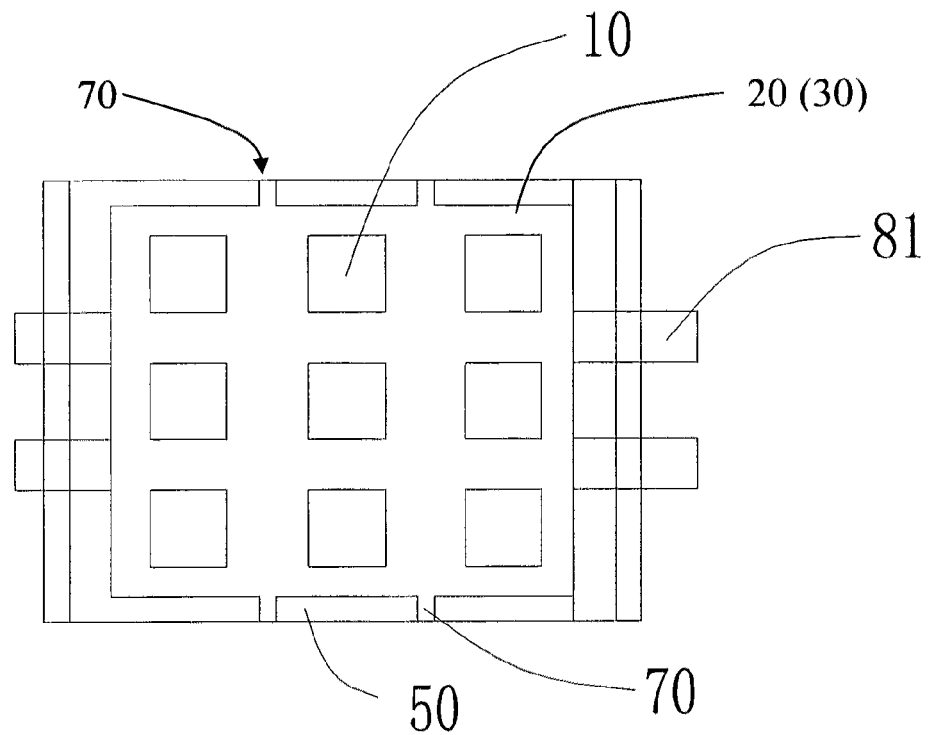
FIG. 12 is a top view illustrating another alternative mode of the LED light source according to the above preferred embodiment of the present invention.

For example, as shown in FIG. 12 of the drawings, the two fluorescent members 20, 30 are two identical rectangular fluorescent chip 20, 30, defining two opposite connecting sides at which a first end and a second end of the electrode member 81 is provided for connecting to the LED members 10.

Figure 13:
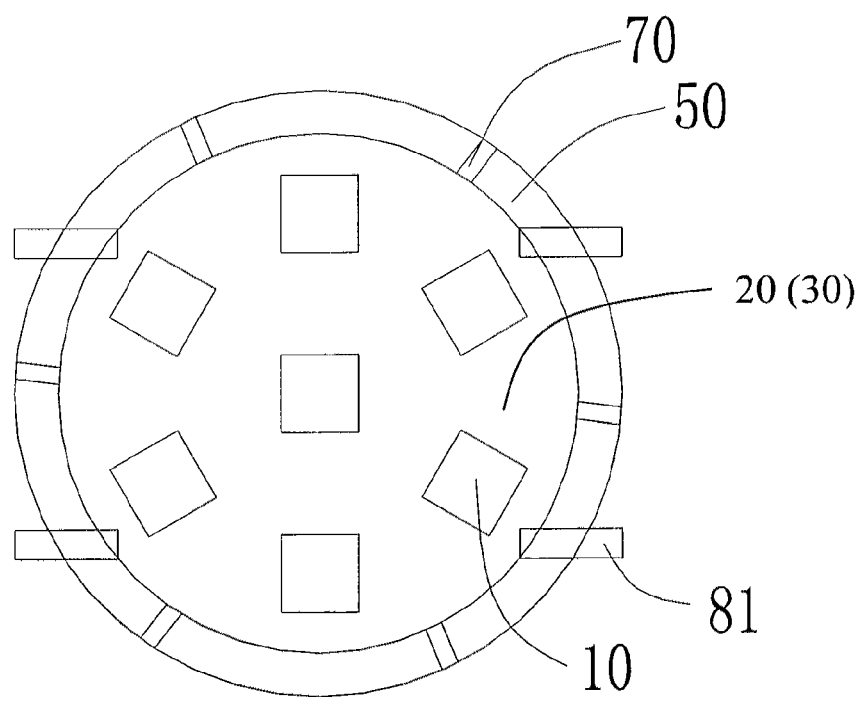
FIG. 13 is a top view illustrating another alternative mode of the LED light source according to the above preferred embodiment of the present invention.

For example, as shown in FIG. 13 of the drawings, the two fluorescent members 20, 30 are two identical round fluorescent chip 20, 30, defining two opposite connecting sides at which a first end and a second end of the electrode member 81 is provided for connecting to the LED members 10. As shown, one of the LED member 10 is positioned in the center from which other LED members 10 are concentrically and outwardly surrounding the LED member 10 at the center position such that the heat passages 40 which are opened to the passage openings 70 are radially provided around the edge portion of the LED light source arrangement 100, thereby optimizing heat dissipation.

Figure 14:
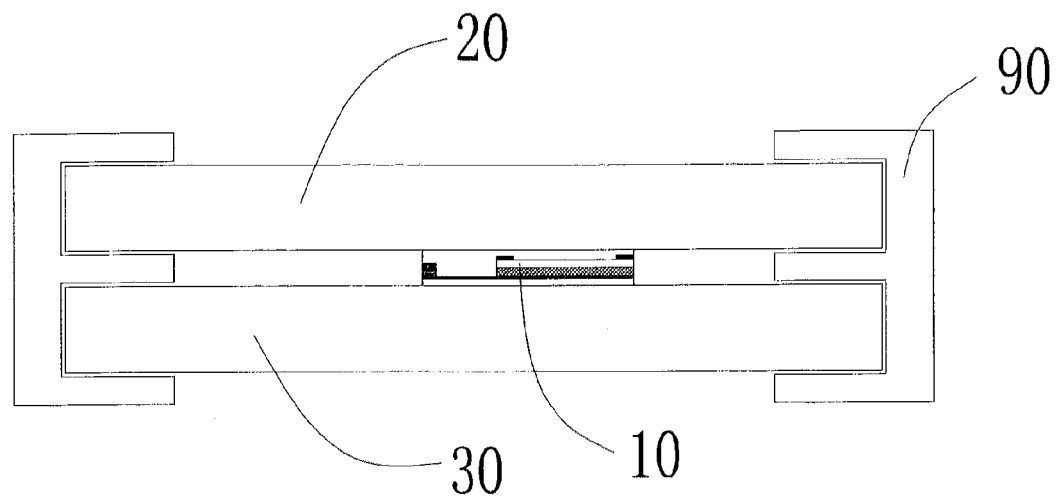
FIG. 14 is a side view illustrating another alternative mode of the LED light source according to the above preferred embodiment of the present invention.
Figure 15:
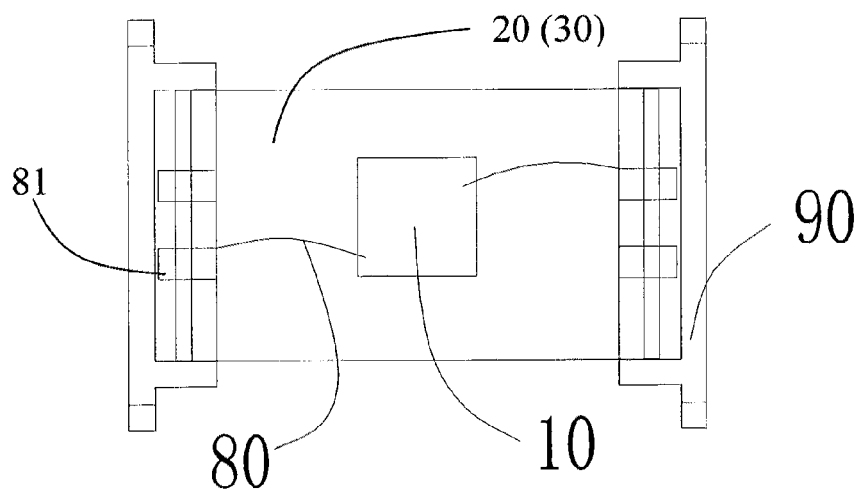
FIG. 15 is a top view illustration of the alternative of FIG. 14 of the LED light source of the above preferred embodiment of the present invention.

Alternately, as shown in FIGS. 14 and 15 of the drawings, the LED light source arrangement 100 comprises one LED member 10 for providing illumination, two fluorescent members 20, 30 sandwiching the LED member 10, a position member 90 positioning the LED member 10 between the two fluorescent members 20, 30, and an electrode member 81 having a first end and a second end connected to two opposite sides of the LED members and positioned at two opposite sides of the LED light source arrangement 100 adapted for electrically connecting the LED member 10 to a power source. It is worth mentioning that the LED member 10 is not required to have a flip chip construction in this embodiment.

Figure 18:
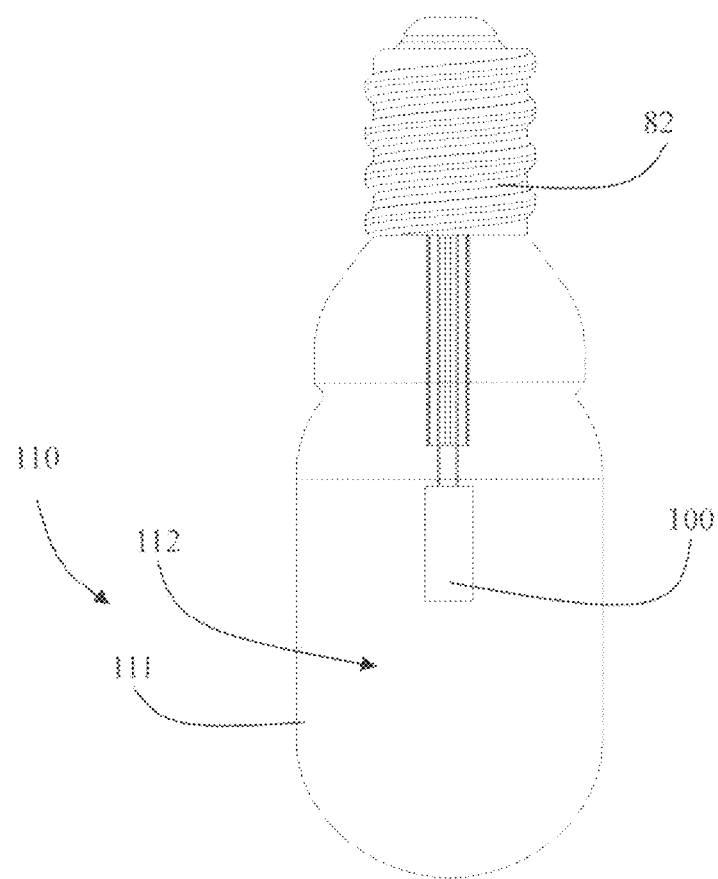
FIG. 18 is a side view illustrating another alternative mode of the LED light source according to the above preferred embodiment of the present invention.
Figure 19:
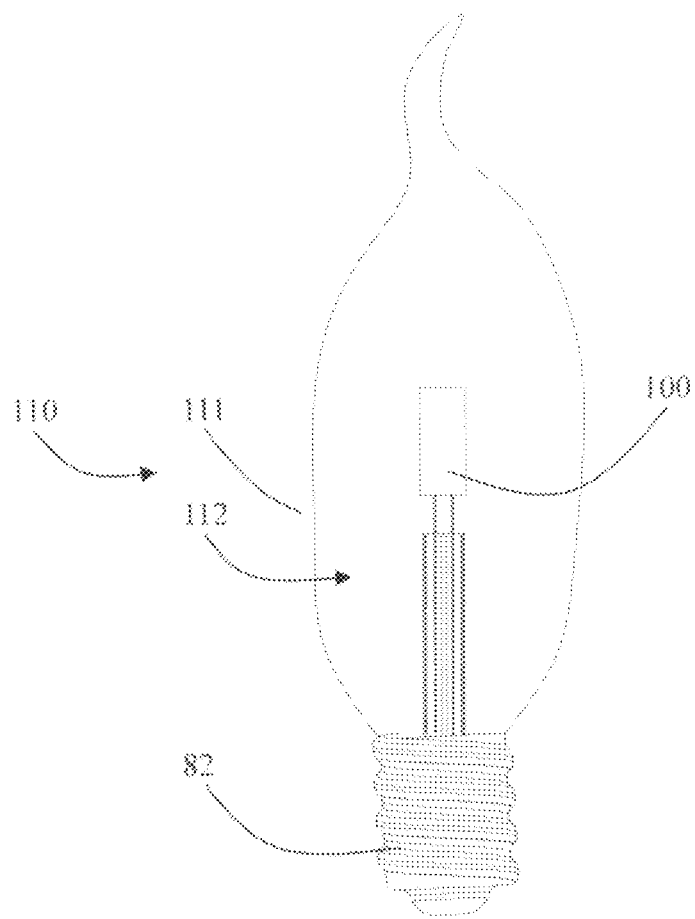
FIG. 19 is a side view illustration of another alternative mode of the LED light source according to the above preferred embodiment of the present invention.
Figure 20:
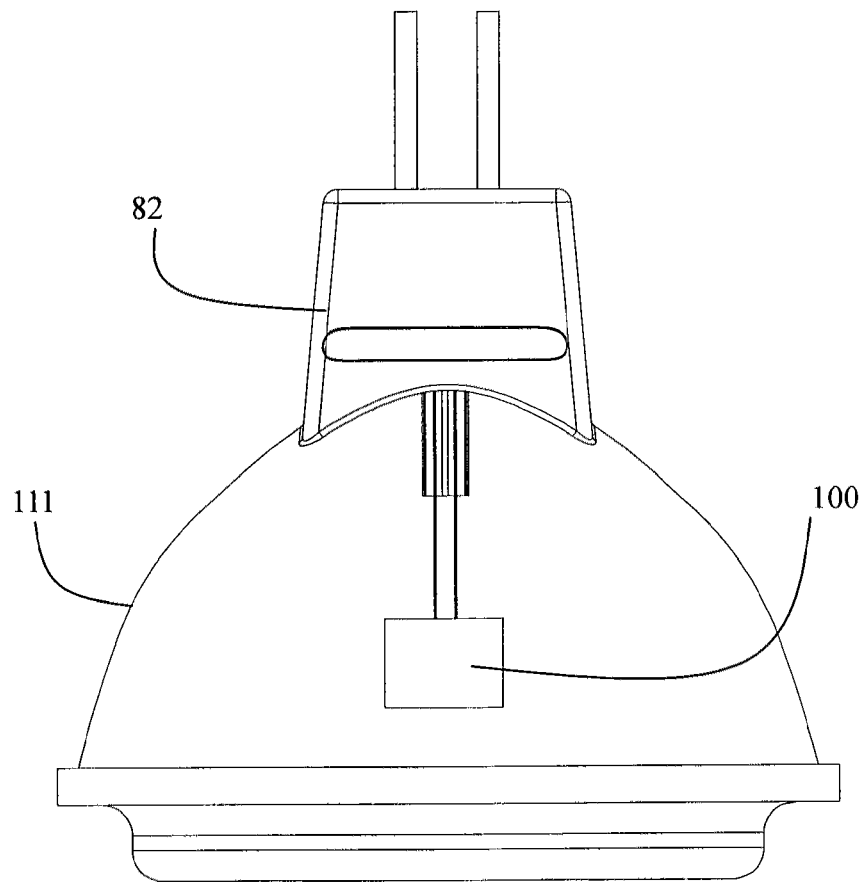
FIG. 20 is a side view illustrating another alternative mode of the LED light source according to the above preferred embodiment of the present invention.

Alternately, as shown in FIG. 18 of the drawings, some illustrative examples for the shell body 111 are illustrated in which the shell body 111 is constructed into different shapes to fit different deigns or uses. For examples, the shell body 111 may have a segmented structured body which is shown in FIG. 18, a candle light structured body as shown in FIG. 19, and a cup structured body which is shown in FIG. 20.

Figure 21:
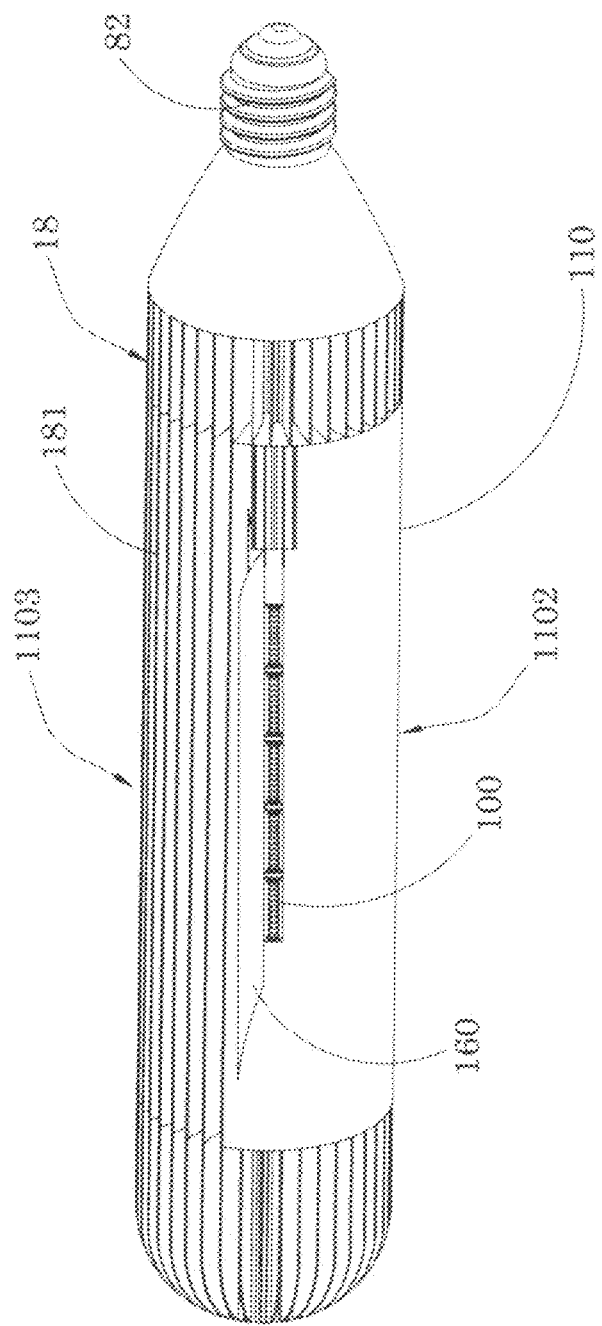
FIG. 21 is a partial exploded view illustrating another alternative mode of the LED light source according to the above preferred embodiment of the present invention.

Preferably, the LED light bulb of the present invention may further comprise a heat guider structure 18 provided at an external surface of the shell body 110 for further increasing the surface area for heat dissipation when high power LED light source arrangement 100 is employed, especially for outdoor lighting. For example, as shown in FIG. 21, the LED light bulb comprises a shell body 110 defining an illuminative surface 1102 at one side and a non-illuminative surface 1103 at an opposed side, a LED light source arrangement 100 for providing illumination effect, a the light reflective member 160 for diverting light from the LED light source arrangement 100 to the illuminative surface 1102 such that the illumination effect is provided through the illuminative surface 1102, and a heat guider structure 18 comprising a plurality of fin members 181 radially extended from the non-illuminative surface 1103 of the shell body 110 for providing additional heat dissipating surface area.

Figure 22:
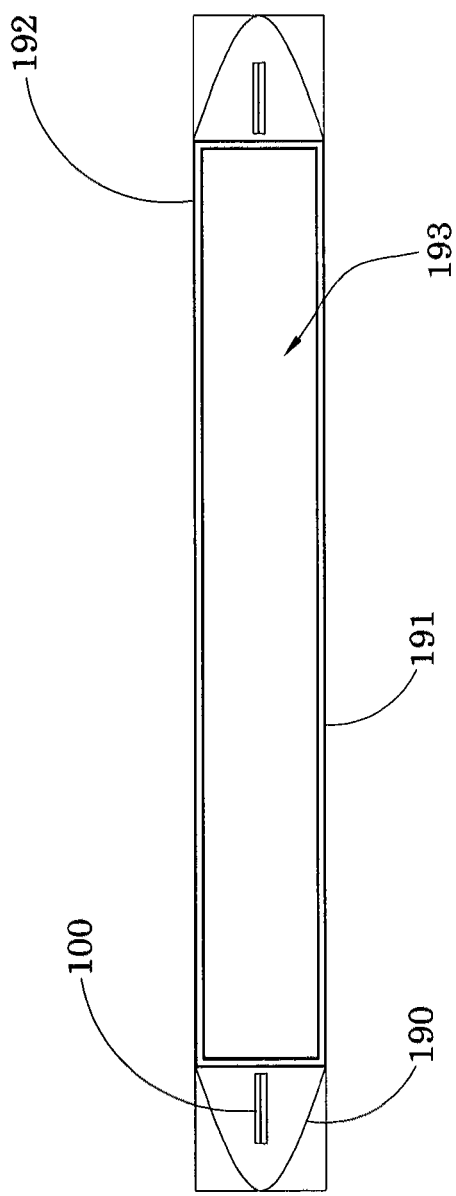
FIG. 22 is a cross-section view illustrating another alternative mode of the LED light source according to the above preferred embodiment of the present invention.

It is worth mentioning that the LED light bulb of the present invention may also be used for a LED backlight display for a computer or a television. Referring to FIG. 22 of the drawings, the LED light bulb is arranged to produce illumination through a reflective cup 190 which is connected to a reflective board 191 and a dispersion board 192 such that the light is guided through the reflective cup 190, the reflective board 191 and the dispersion board 192 to a light guiding panel 193 for providing illumination effect.

It is worth mentioning that, compared to conventional lighting fixture, the LED light source also emits heat while providing illumination and the heat produced, which substantially increases the environmental temperature, will significantly and adversely affect the lighting efficacy of the LED light source. In the conventional art, the lighting effect of a LED light source is produced by electroluminescence through the electrons and holes as affected by external energy provided through electricity at the p-n junction and that the lighting effect at the p-n junction has to pass through the semiconductor materials and the encapsulation materials of the LED light source itself to reach outside for providing the lighting effect. As a result, in view of the energy input and energy efficacy of energy input, the light radiation output and the light transmission efficacy, the percentage of energy conversion to light energy is only approximately 30% to 40% while that to heat energy is about 70%. Accordingly, the heat management is the key factor concerned for development in the conventional arts. Compared to the conventional arts, the present invention navigates the development to increasing lighting efficacy and reducing heat production, which is effective in solving the problem of low efficiency of LED light source.

The LED light source of the present invention, effectively avoiding the prejudice or the practice of the use of heat sink specialized for LED light sources in the conventional arts, makes use of the characteristics of electroluminescence which is capable of providing lighting effect on all sides, optimizing the use of the lighting effect on all sides such that the light efficacy is increased by 30% or above. At the same time, the present invention effectively solves the bottleneck problem in relation to heat dissipation induced by the conventional heat sink which serves as the major or sole channel for heat dissipation through providing an open area around the LED light source member and the provision of passages such that lighting efficacy as well as the efficiency of heat dissipation is greatly increased. In addition, the increased efficiency of heat dissipation has provided a lower environmental temperature which further optimizes the conditions for the electrons and holes to provide a highly effective lighting effect through electroluminescence, hence producing a cycle of high heat dissipation efficiency-high lighting efficacy-high heat dissipation efficacy. In a testing of the LED light source of the present invention, the percentage of energy conversion from electric energy to light energy can be 85% or above.

In addition, the additional use of filled inert gas around the LED members 10 for direct heat exchange has further lowered the environmental temperature of the LED members, and hence further increases the percentage of energy conversion from electric energy to light energy to 90% or above, which is a significant effect produced by the present invention.

Figure 23:
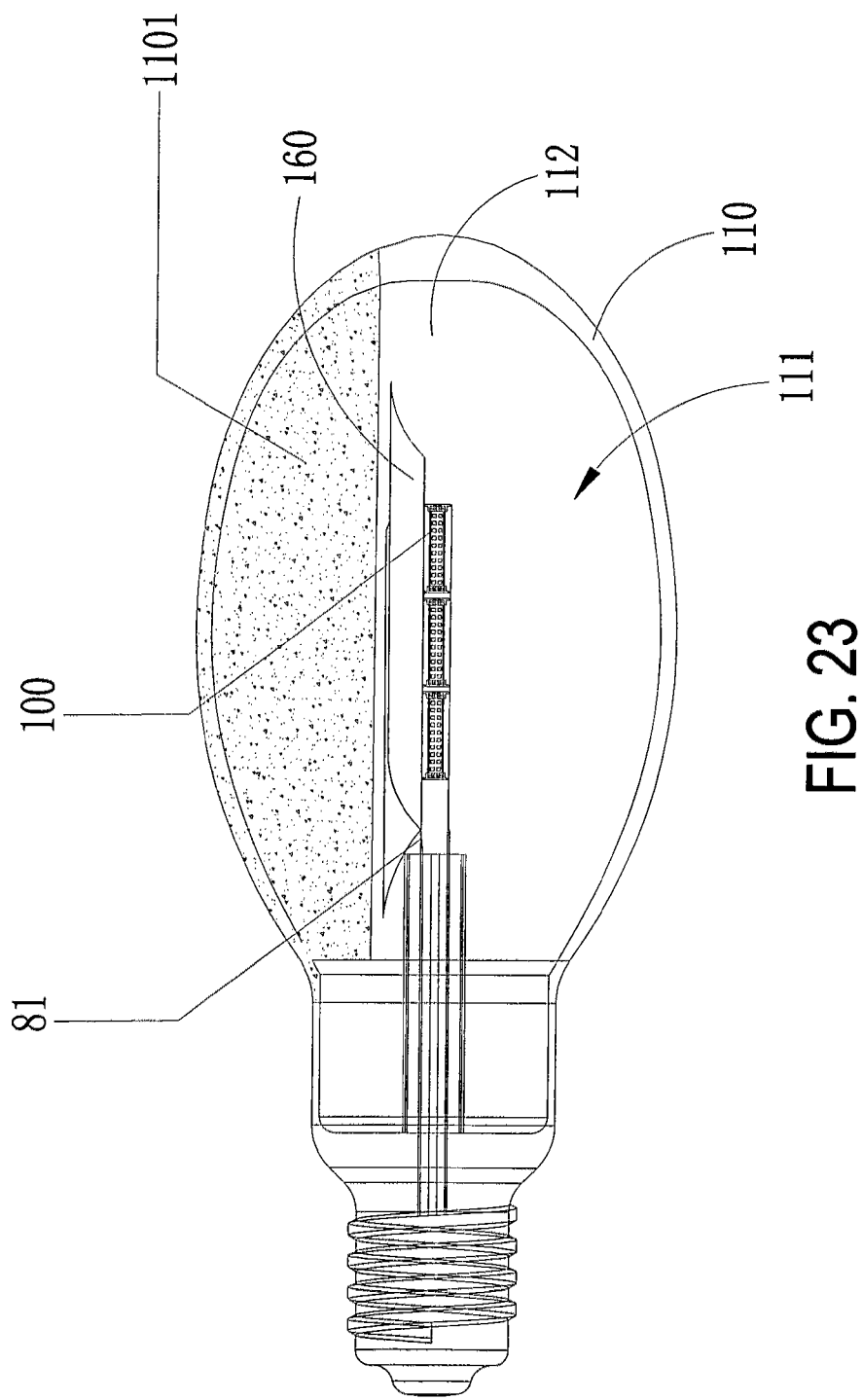
FIG. 23 is a partial exploded view illustrating another alternative mode of the LED light source according to the above preferred embodiment of the present invention.
Figure 24:
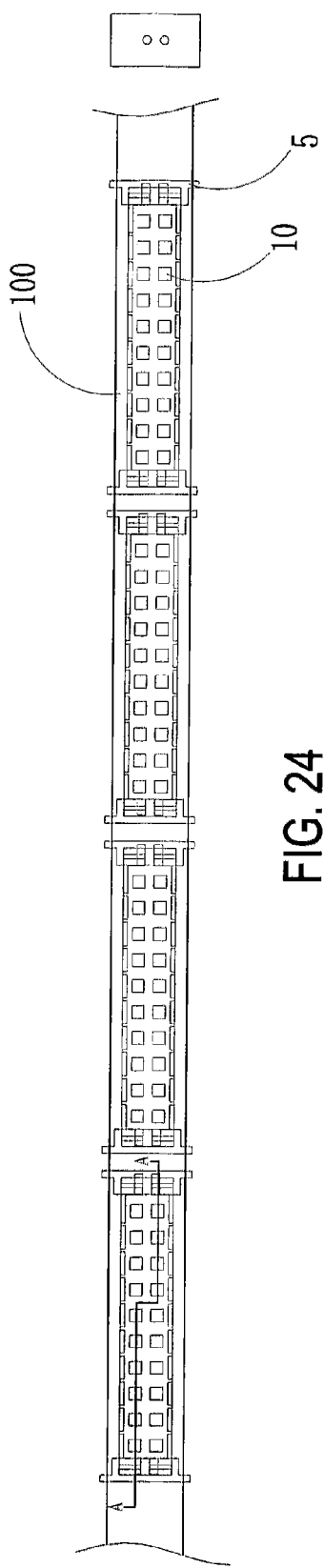
FIG. 24 is a top view illustrating a LED arrangement of the alternative mode of FIG. 23 of the LED light source according to the above preferred embodiment of the present invention.
Figure 25:
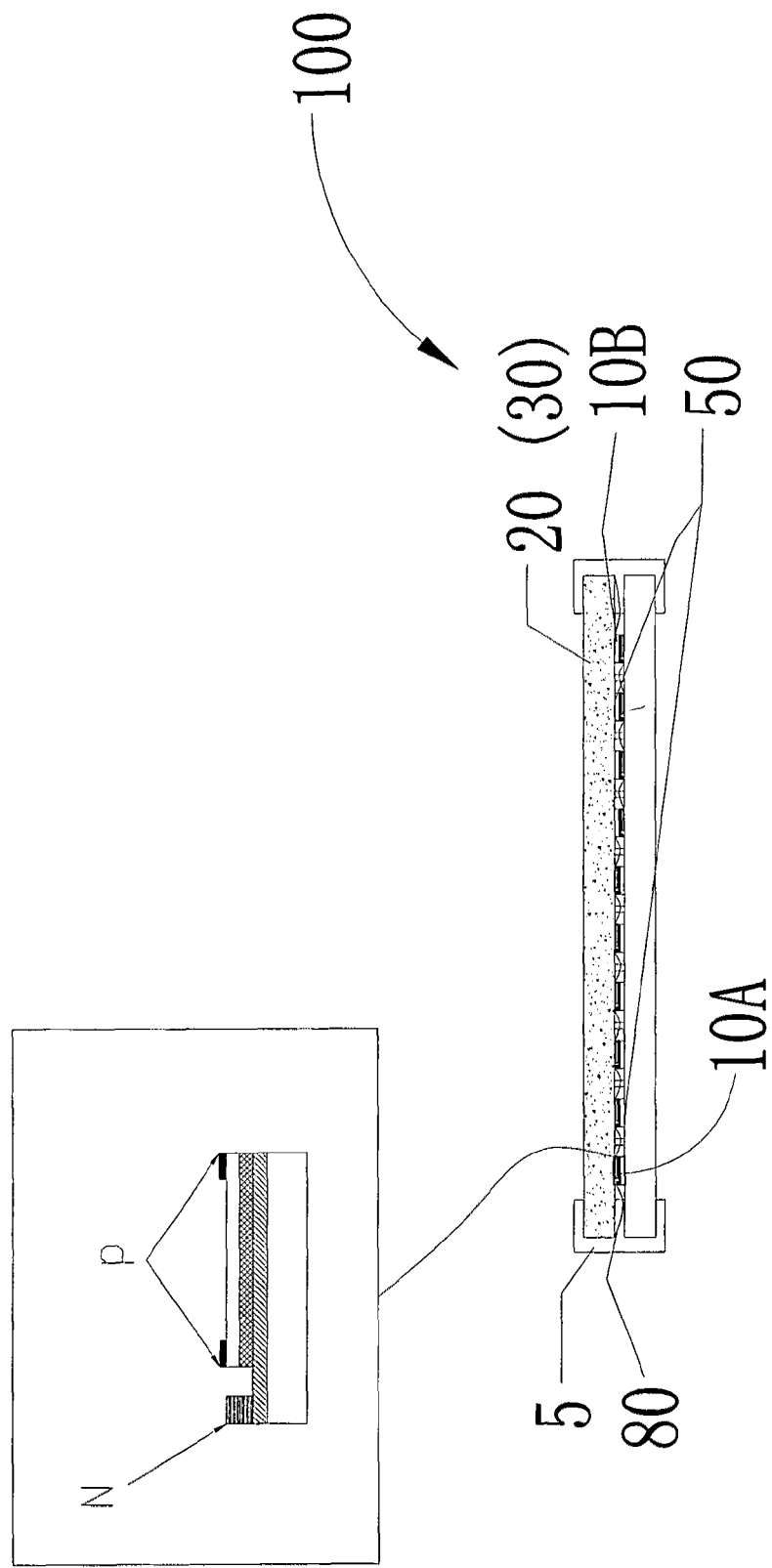
FIG. 25 is an A-A cross-sectional view illustrating a LED arrangement of the alternative mode of FIG. 24 of the LED light source according to the above preferred embodiment of the present invention.

In an alternative mode of the present invention, as shown in FIGS. 23 to 25 of the drawings, the LED light source comprises a shell body 110 and one or more LED light source arrangements 100 received and supported inside the shell body 110. The shell body 110 defines a shell cavity 111 inside the shell body 110 adapted for filling with a filled gas 112. Each of the LED light source arrangements 100 comprises a plurality of LED members 10, a plurality of connecting members 80, such as connecting wires, electrically connecting the LED members 10, two fluorescent members 20, 30, an electrode member 81, and a light reflective member 160.

The two fluorescent members 20, 30 are provided on top of the two light emitting surfaces 11, 12 of the LED members 10 to retain the LED members 10 into position such that the illumination generated from the LED members 10 is capable of passing through the two fluorescent members 20, 30 from the two light emitting surfaces 20, 30 to provide illumination at an angle greater than 180° through electroluminescence at the two light emitting surfaces 11, 12.

The electrode member 81 is electrically coupled with the LED members for electrically connecting the LED members, which are connected through the connecting element 80, to a power source.

The light reflective member 160 is extended sideward from one of the side of one fluorescent member 20 (30) at a position spacedly extending along the LED light source arrangement 100 in such a manner that light emitted from the LED member 10 is guided through a reflective surface of the reflective member 160 to project at one direction, which is useful for providing a lighting effect at one direction. In other words, the light emitted from the LED light source is collected and reflected to a predetermined direction through the provision of light reflective member 160.

The LED members 10 are arranged in such a manner that even and optimal light emission is resulted. Accordingly, each of two LED members 10 are arranged in pair in which one of the LED members 10, defining a first LED member 10A, has a flip-chip construction and the other, defining a second LED member 10B, has a standard construction. For example, as shown in FIGS. 24 and 25 of the drawings, a plurality of pairs of the LED members 10 are arranged to form two rows for providing even and optimal light emission. In other words, two rows of LED members 10 with alternative constructions, which are flip-chip construction and standard construction, are aligned for providing an even and optimal lighting effect.

The shell body 110 may further have a shell coating 1101 for facilitating heat transfer. For example, as shown in FIG. 23, the shell coating 1101 is provided throughout the inner surface of the shell body 110. Preferably, shell coating 1101 is made of polydimethylsiloxane or materials with similar heat transfer properties.

Figure 27:
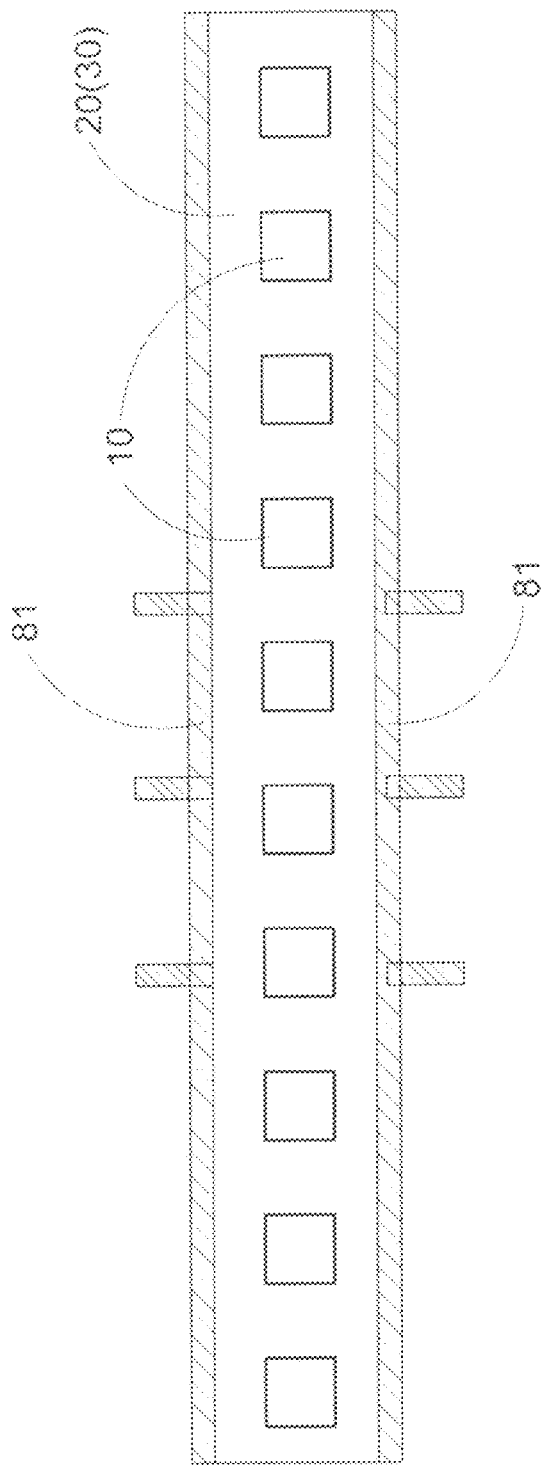
FIG. 27 is a sectional view illustrating an alternative mode of the LED light source according to the above preferred embodiment of the present invention.
Figure 28:
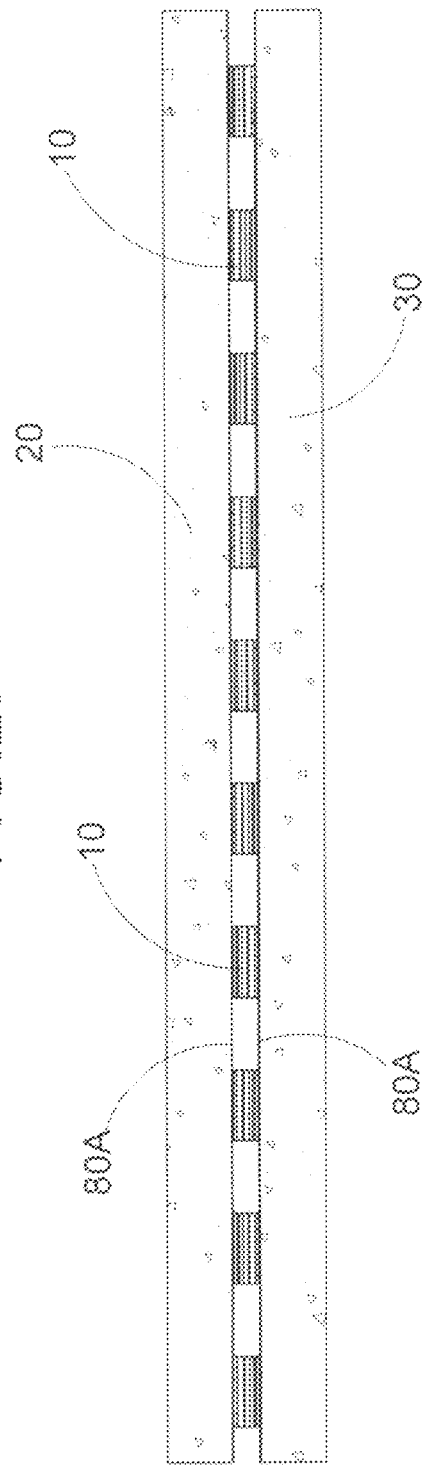
FIG. 28 is a sectional view of the alternative LED light source according to the above preferred embodiment of the present invention.
Figure 30:
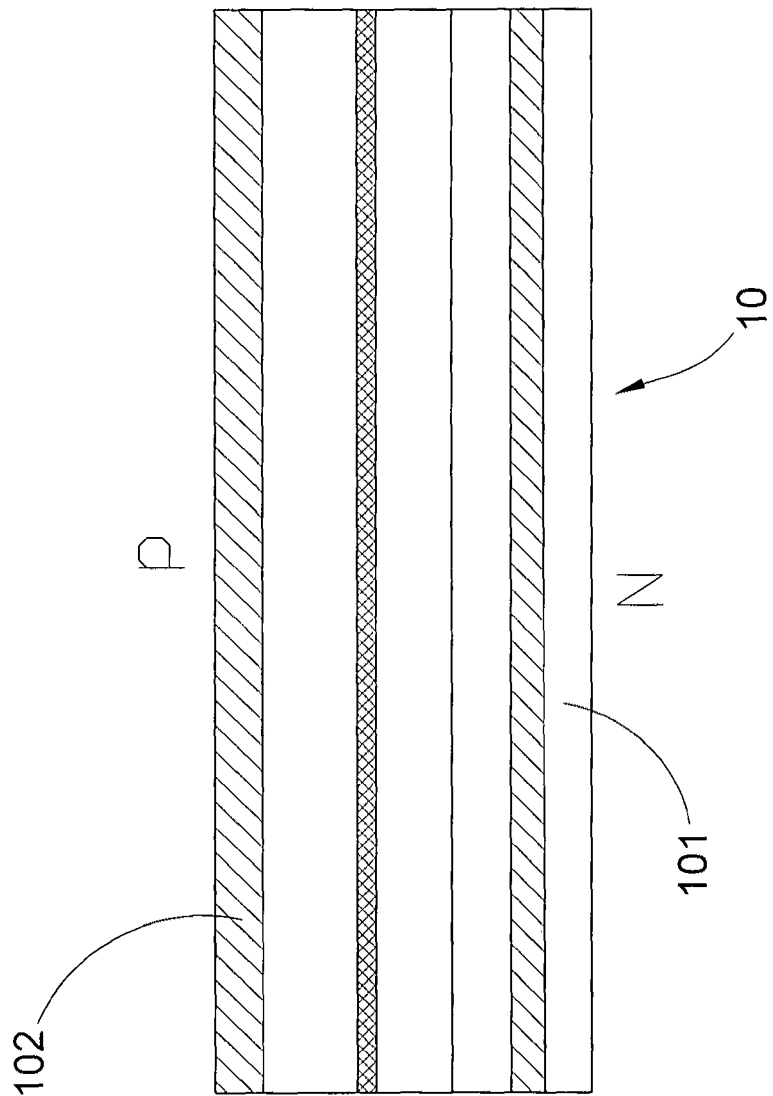
FIG. 30 is a sectional view illustrating the p-type doping unit and the n-type doping unit of the LED member according to the above preferred embodiment of the present invention.

FIGS. 27, 28 and 30 illustrate another alternative mode of the LED light source, which further comprises an electric conductive layer 80A overlapped on at least one of the fluorescent members 20, 30, wherein the LED member 10 is electrically contacted with the electric conductive layer 80A, such that the LED members 10 are electrically connected in series or in parallel and the LED members 10 are electrical connected to the electrode member 81 through the electric conductive layer 80A. In other words, the connecting element 80 for electrically connecting the LED member 10 as mentioned above can be omitted. In other words, the connecting element can be a connecting wire or a printed circuit to electrically link with the LED members 10.

Figure 29:
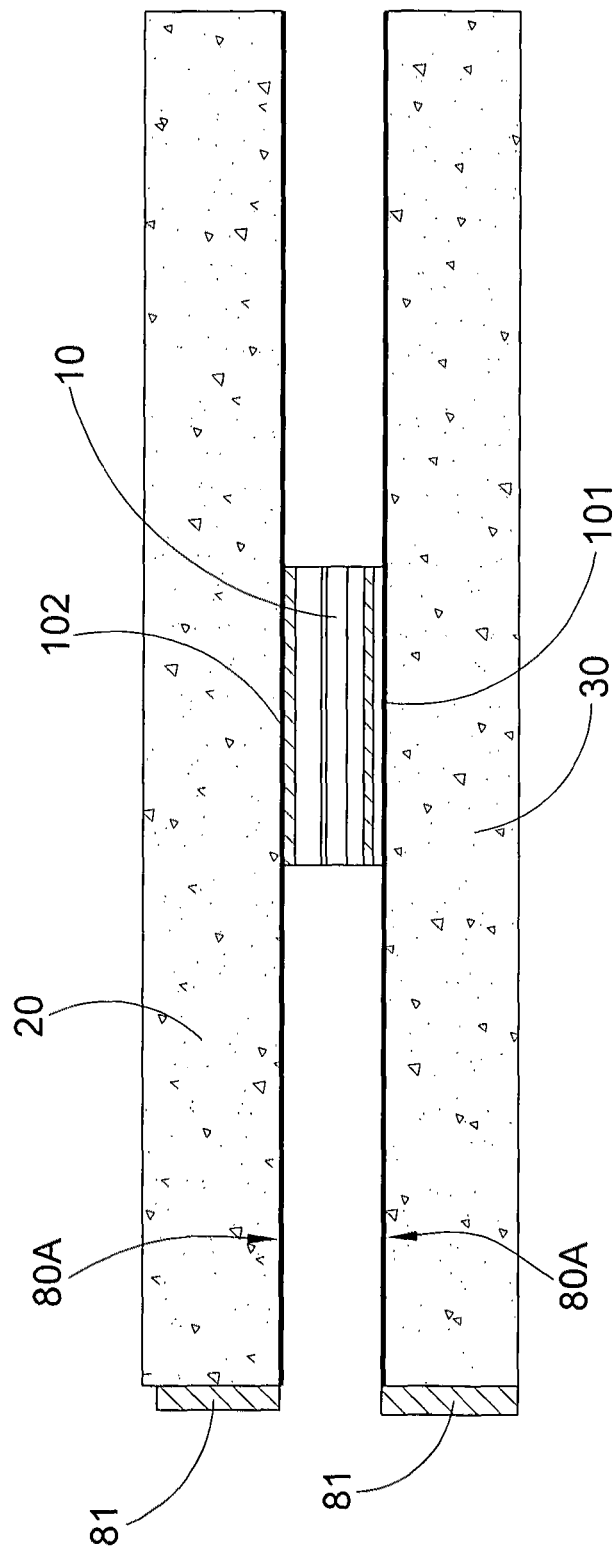
FIG. 29 is a sectional view illustrating the LED member being electrically connected with electric conductive layer according to the above preferred embodiment of the present invention.

As shown in FIGS. 27 to 29, the electric conductive layer 80A is coated on each of the fluorescent members 20, 30 as a printed circuit layer, wherein the electric conductive layer 80A is preferably made of transparent material adapted for the light being transmitted therethrough such that when the light is generated by the LED member 10, the light can penetrate through the electric conductive layer 80A to the fluorescent member 20, 30.

As shown in FIGS. 29 and 30, the two opposite facets of the LED member 10 are electrically coupled with the electric conductive layers 80A of the fluorescent members 20, 30 respectively. In particular, the p-type doping unit 102 and n-type doping unit 101 are positioned at two opposite facets of the LED member 10 to electrically couple with the electric conductive layers 80A of the fluorescent members 20, 30 respectively. According to the preferred embodiment, the electric conductive layer 80A can be a printed circuit layer coated at the fluorescent member 20, 30 at a position to align with the p-type doping unit 102 and the n-type doping unit 101 of the LED member 10 when the LED member 10 is coupled at the fluorescent member 20, 30. Accordingly, the LED light source of the present invention can be incorporated with an AC power source without using any AC-to-DC converter or transformer.

More than two LED members 10 can be spacedly and alignedly coupled with the fluorescent members 20, 30 at a position that the LED members 10 are electrically connected with each other via the electric conductive layers 80A. In addition, the electrode members 81 are provided at side edge ends of the fluorescent members 20, 30 and are electrically connected with the electric conductive layer 80A respectively such that when the LED members 10 are coupled at the fluorescent members 20, 30, the LED members 10 are electrically linked with the electrode members 81 via the electric conductive layers 80A. Accordingly, through the above manufacture method, the cost of manufacture is effectively lowered while the lighting efficacy and the efficiency of heat dissipation are greatly increased.

It is worth mentioning that the electric conductive layer 80A can be formed at one of the fluorescent members 20, 30, wherein the p-type doping unit 102 and the n-type doping unit 101 are positioned at the same facet of the LED member 10, i.e. the p-type doping unit 102 and the n-type doping unit 101 are located at one of the light emitting surfaces 11, 12 of the LED member 10, such that the p-type doping unit 102 and the n-type doping unit 101 of the LED member 10 can be electrically coupled with the electric conductive layer 80A at one of the fluorescent members 20, 30. As shown in FIG. 29A, the electric conductive layer 80A is embodied as a printed circuit layer formed on the respective fluorescent member 20 having a plurality pairs of connecting bases 80A1 printed on the respective fluorescent member 20, 30 for electrical connecting with the p-type doping unit 102 and the n-type doping unit 101 of each LED member 10 respectively and a plurality of connecting elements 80A2 printed on the respective fluorescent member 20, 30 for electrically linking the LED members 10, while the LED members 10, each having the p-type doping unit 102 and the n-type doping unit 101 at the same light emitting surfaces 11, are electrically coupled with the electric conductive layer 80A.

It is also worth mentioning that the LED members 10 of the LED light source arrangement 100 to be installed in a shell body 110 to form the LED light bulb structure, as shown in FIGS. 7-10, 18-21, and 23-24, are able to be aligned end-to-end with different orientation to form an elongated structure such as the LED light source arrangement illustrated in FIG. 6A to provide an all angle light emission feature. Different orientation arrangement of the LED members of the LED light source arrangement should be considered as apparent alternatives of the present invention.

Figure 26:
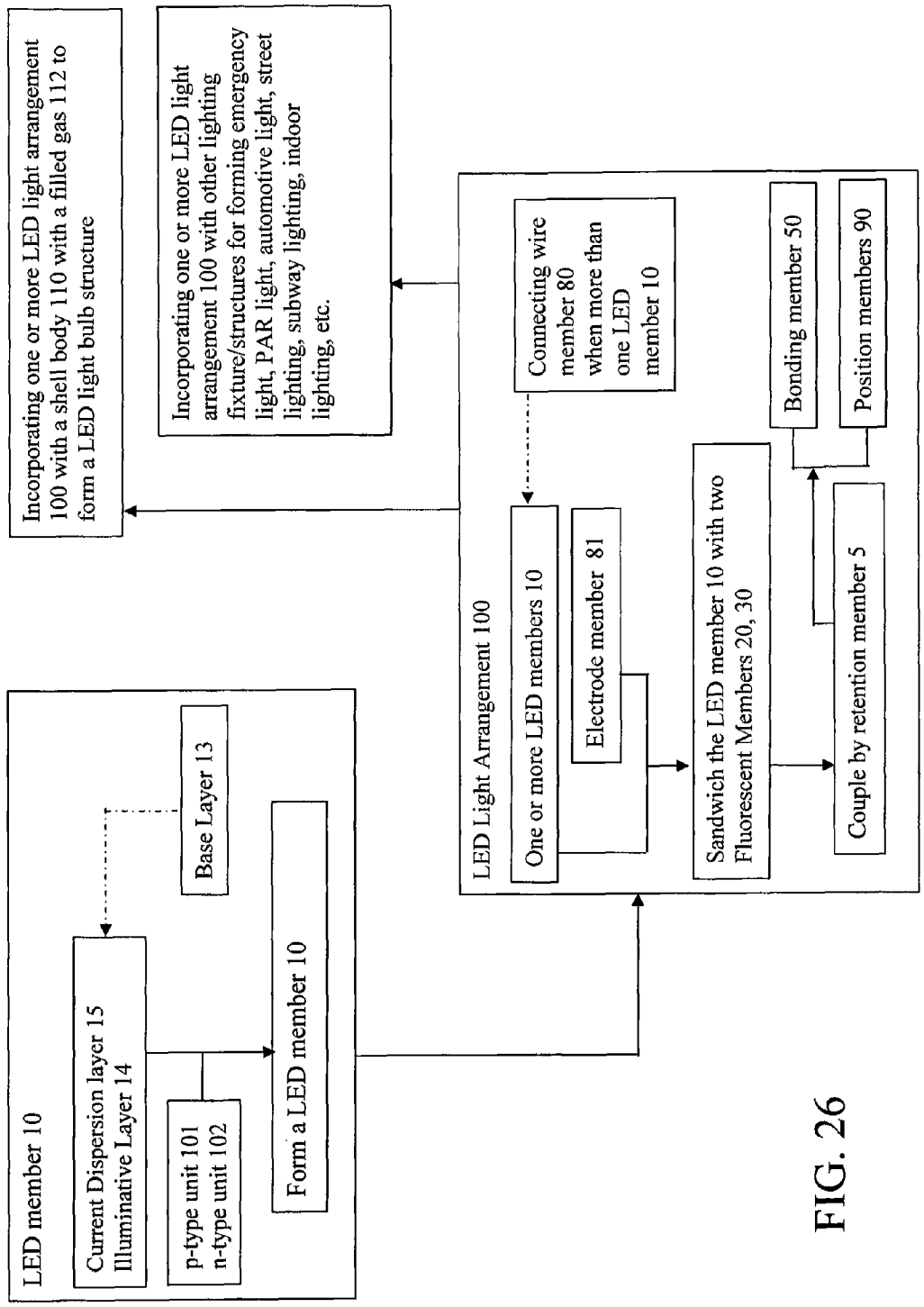
FIG. 26 is a schematic diagram of a manufacturing method of the LED light source according to the above preferred embodiment of the present invention.

The present invention further provides a manufacturing method of the LED light source of the above preferred embodiment. Referring to FIG. 26 of the drawings, the manufacturing method of the LED member 10 comprises the following steps.

(1) Overlap the first current dispersion layer 15 and the second illuminative layer 14 preferably at a horizontal orientation.

(2) Form the LED member 10 which defines two light emitting surfaces 11, 12 through doping the LED member 10 to form a p-type doping unit 102 on the current dispersion layer 15 and a n-type doping unit 101 on the illuminative layer 14 such that a p-n junction is defined between said two layers 14, 15 at which electroluminescence is arranged to occurred.

Preferably, the method further comprises the step of bonding the third base layer 13 to the illuminative layer 14.

The manufacturing method of the LED arrangement 100 comprises the following steps.

(a) Sandwich at least one of the LED members 10 with two fluorescent members 20, 30 such that the two light emitting surfaces 11, 12 of the LED member 10 are biased against said two fluorescent members 20, 30 directly for support and direct heat transfer.

(b) Electrically couple the electrode member 81 with the LED member 10 for electrically connecting the LED member 10 to the power source.

(c) Form a LED light source arrangement 100 by retaining the two fluorescent members 20, 30 with a retention member 5 to define the LED receiving cavity 51 for receiving one or more LED members 10 in such a manner that one or more passage openings 70 is defined between the LED receiving cavity 51 and an external environment outside the LED receiving cavity 51 such that direct heat transfer away from the LED-layered unit 10' through the passage openings 70 is attained.

It is worth mentioning that the two fluorescent members 20, 30 can be used to receive a plurality of LED members 10. Accordingly, the LED members 10, in the step (a), are alignedly sandwiched between two fluorescent members 20, 30 such that the two light emitting surfaces 11, 12 of the LED members 10 are biased against the two fluorescent members 20, 30 directly for support and direct heat transfer.

When a plurality of LED members 10 are included, the LED members 10 are arranged to align in such a manner that a heat passage 40 is defined between two adjacently positioned LED members 10 which are opened to the passage openings 70, adapted for optimizing heat dissipation.

When the manufacture of a light bulb is involved, the method further comprises the following steps.

(A) Support one or more LED light source arrangement 100 within the shell cavity 111 of the shell body 110.

(B) Form a LED light bulb structure by electrically connecting the electrode member 81 to the light bulb adapter 82 of the shell body 110 such that the LED light source arrangement 100 is received inside the shell cavity 111 filled with the filled gas 112, whereby the filled gas 112 is served as a medium for heat transfer, adapted for guiding the heat generated from the LED light source arrangement 100 to reach the shell body 110.

When a plurality of LED light source arrangements 100 is included, a light effect construction 17 may be provided for optimizing the illumination effect. Accordingly, the method further comprises the steps of:

(A.1) Provide a light effect construction 17 which comprises one or more connector 170, each for connecting one of the LED light source arrangements 100 to the light bulb adapter 82 of the shell body 110 so as to position the LED light source arrangements 100 at an optimized position inside the shell cavity 112 in such a manner that the illumination generated from the LED light source arrangement 100 is capable of reaching an illuminative surface 1102 of the shell body 110 in entirely.

It is worth mentioning that the retention member 5 can be a bonding member 50 or two position members 90 for securing the two fluorescent members 20, 30 through molecular bonding or clipping. The LED member 10 can be a two-layered LED member 10 or a three-layered LED member 10 for providing illumination at two surfaces.

Figure 31:
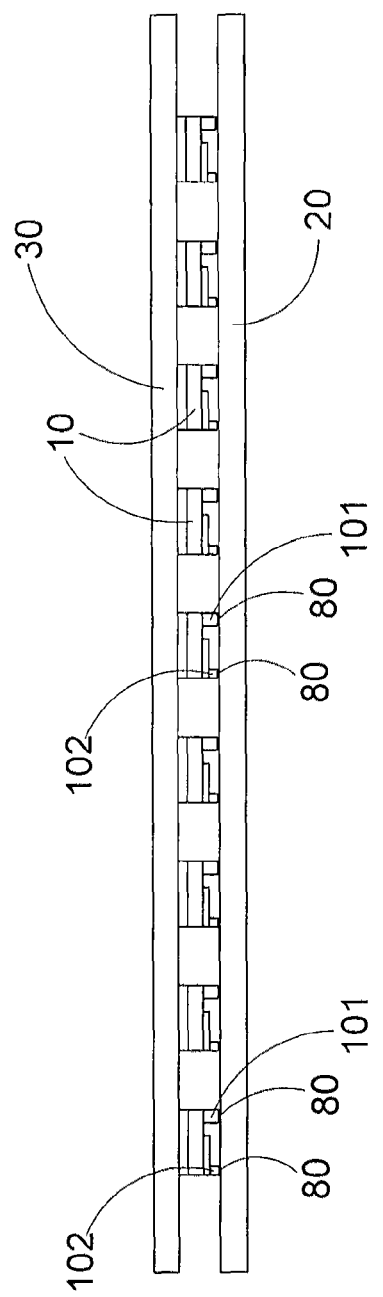
FIG. 31 is a side view illustrating the installation of the LED member at the fluorescent member in an up-side-down manner according to the above preferred embodiment of the present invention.
Figure 32:
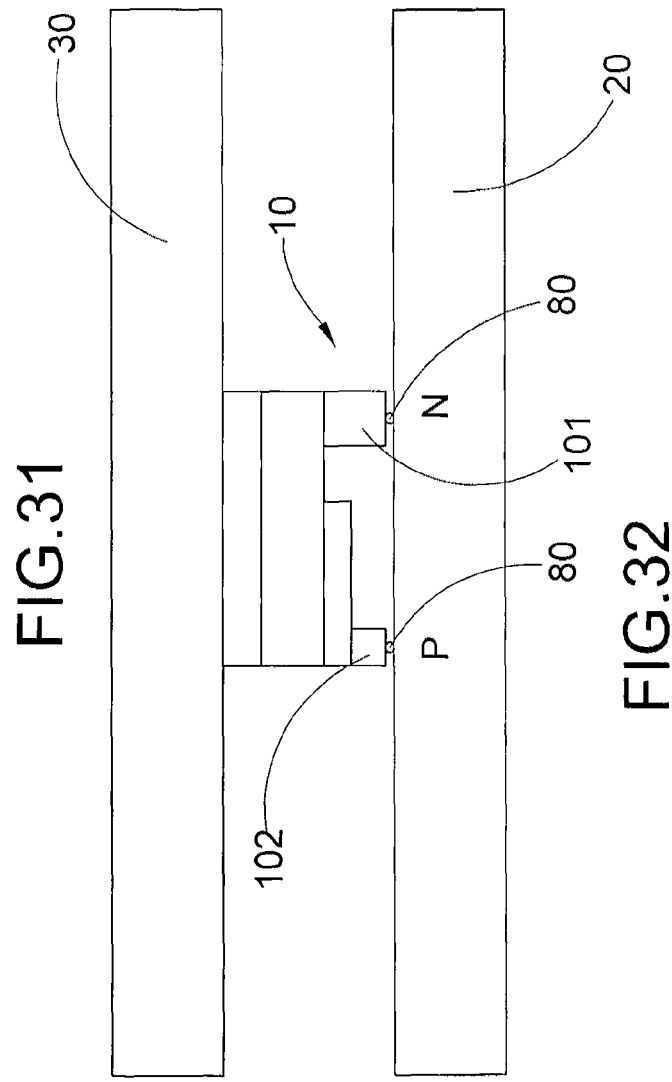
FIG. 32 is a side view illustrating the location of the LED member at the fluorescent member in an up-side-down manner according to the above preferred embodiment of the present invention.

Alternatively, the LED light source of the present invention can be manufactured by the following method, as shown in FIGS. 31 and 32.

Each of the LED members 10 is coupled at the first fluorescent member 20 at a position that each of the LED members 10 is mounted at an up-side-down manner as shown in FIG. 31. Accordingly, the p-type doping unit 102 and the n-type doping unit 101 are positioned at the same facet of the LED member 10 to couple with the first fluorescent member 20, as shown in FIG. 32. The connecting element 80 is preconfigured at the first fluorescent member 20 to form a plurality of protrusion points on the first fluorescent member 20 and to align with the LED member 10 such that when the LED member 10 is coupled with the first fluorescent member 20, the LED member 10 is electrically connected with the connecting element 80.

It is appreciated that the electric conductive layer 80A, which is embodied as a printed circuit layer, can be preformed on the first fluorescent member 20 to electrically connect with the LED member 10 when the LED member 10 is coupled with the first fluorescent member 20. Then, the second fluorescent member 30 can be overlapped on the LED members 10 after the LED members 10 are coupled at the first fluorescent member 20 so as to sandwich the LED members 10 between the fluorescent members 20, 30. It is worth mentioning that the LED members 10 can be precisely located on the first fluorescent member 20 and retained between the two fluorescent members 20, 30 through this method.

Figure 33:
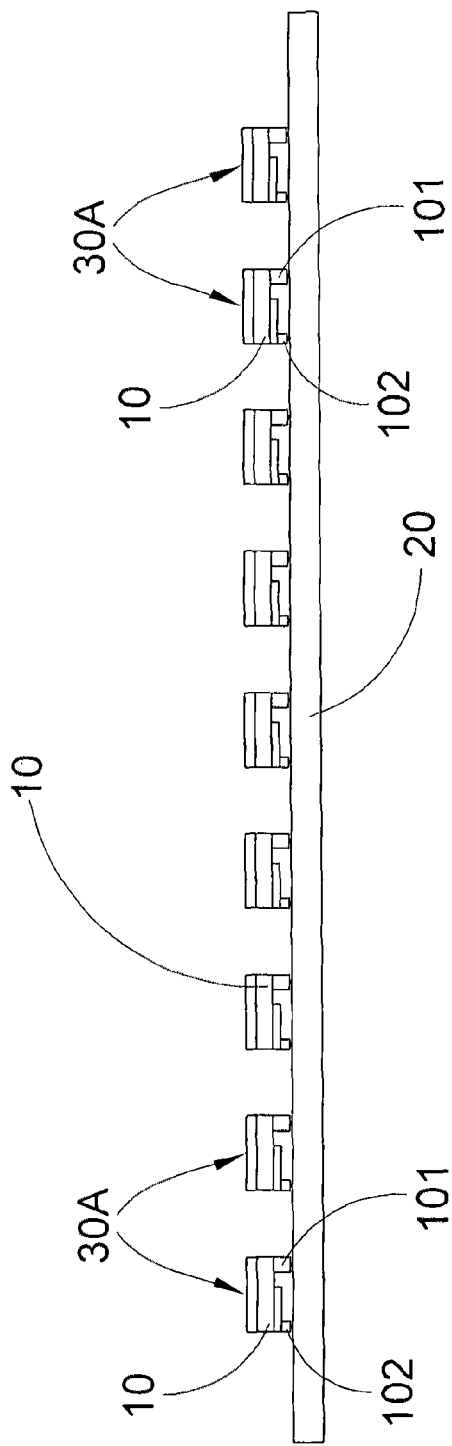
FIG. 33 is a side view illustrating the fluorescent layer according to the above preferred embodiment of the present invention.

FIG. 33 illustrates an alternative mode of the fluorescent member 30A, wherein the fluorescent member 30A is embodied as a thin fluorescent layer 30A overlapped on each of the LED members 10, wherein the fluorescent layer 30A functions as the above mentioned fluorescent member 30. Accordingly, since the p-type doping unit 102 and the n-type doping unit 101 are positioned at the same facet of the LED member 10, the fluorescent layer 30A is formed, preferably by coating, on the opposite facet of the LED member 10. Therefore, the overall thickness of the LED light source can be substantially reduced by reducing the thickness of the fluorescent member 30 via the fluorescent layer 30A. In particular, each of the LED members 10 is constructed to have the illuminative layer 14 and the current dispersion layer 15, wherein the p-type doping unit 102 and the n-type doping unit 101 are positioned at the current dispersion layer 15 as the protrusion connecting points of the LED member 10.

Figure 34:
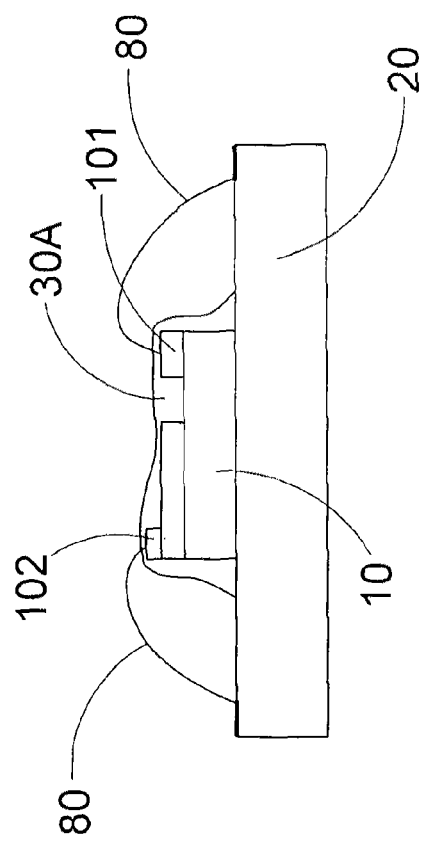
FIG. 34 is a side view illustrating a first alternative mode of the fluorescent layer according to the above preferred embodiment of the present invention.

As shown in FIG. 34, the LED member 10 is coupled at the first fluorescent member 20, wherein the p-type doping unit 102 and the n-type doping unit 101 are positioned at the same facet of the LED member 10 which is opposite to the first fluorescent member 20. The fluorescent layer 30A, as the replacement of the fluorescent member 30A, is coated on the LED member 10 to cover the p-type doping unit 102 and the n-type doping unit 101 so as to cover the LED member 10 on the first fluorescent member 20. Accordingly, the connecting element 80 is formed on the first fluorescent member 20 by ultrasonic welding to electrically couple with the p-type doping unit 102 and the n-type doping unit 101, wherein the connection points of the p-type doping unit 102 and the n-type doping unit 101 with the connecting elements 80 are covered by the fluorescent layer 30A.

FIG. 35 illustrates an alternative position of the LED member 10, wherein the LED member 10 is coupled at the first fluorescent member 20 that the p-type doping unit 102 and the n-type doping unit 101 are positioned at the same facet of the LED member 10 towards the first fluorescent member 20. In other words, the p-type doping unit 102 and the n-type doping unit 101 are electrically coupled with the connecting elements 80 on the first fluorescent member 20 via welding. The fluorescent layer 30A, as the replacement of the fluorescent member 30A, is coated on the LED member 10 to cover the LED member 10 on the first fluorescent member 20.

Alternatively, the fluorescent member 30 can be formed as a plurality of discrete fluorescent members 31A overlapped on the LED members 10 respectively to replace the base layer 13 such that the discrete fluorescent member 31A is overlapped on the illuminative layer 14 as shown in FIG. 36. In other words, the base layer 13 is omitted and is replaced by the fluorescent layer 30A as shown in FIG. 36.

In other words, the base layer 13 can be formed as the sapphire layer bonded to the corresponding fluorescent member 30, an integrated layer integrated with the corresponding fluorescent member 30, the thin fluorescent layer 30A, or the discrete fluorescent members 31A. It is worth mentioning that the embodiment and its alternatives are interchangeable and can be applied at different light apparatuses as the LED light bulb as shown in FIGS. 6-11, and 18-23. In addition, the connecting element 80 and the electric conductive layer 80A are interchangeable to electrically couple with the p-type doping unit 102 and the n-type doping unit 101 of the LED member 10. The p-type doping unit 102 and the n-type doping unit 101 can be either formed at the same facet of the LED member 10 or formed at the opposite facets of the LED member 10 to electrically couple with the connecting element 80 or the electric conductive layer 80A.

Accordingly, through the above manufacturing methods, the cost of manufacture is effectively lowered while the lighting efficacy and the efficiency of heat dissipation are greatly increased. In addition, the conventional LED light source having a resin casing sealed therewith will generate a relative high amount of heat at 200° C. at the terminal point because the heat is retained and sealed within the resin casing and the heat can only be transmitted through the sapphire base. Therefore, the light intensity of the conventional LED light source will be reduced when the temperature of heat generated by the conventional LED light source is increased. Comparing with the present invention, the LED light source of the present invention will only generate the heat at about 40-50° C. because the heat can be efficiently dissipated through the fluorescent members 20, 30 such that a conventional fan can be incorporated with the LED light source for generating an air flow for enhancing the heat dissipation of the LED light source of the present invention. Once the ambient temperature of the LED light source is reduced, the light intensity of the LED light source will be increased, so as to minimize the heat generated therefrom.

In addition, the present invention overcomes an unsolved drawback generated from a traditional technical bias that the LED requires a specific heat dissipation base as a supporting body. No heat dissipation base is used in the present invention but producing a capability of light emitting via both sides of the LED light source, that overcomes the angle limitation of the conventional LED and provides the possibility of utilizing light energy from all emitting angles, so that at least a 30% more of the light energy utilizing capability can thus be achieved. In other words, the present invention substantially and completely overcomes the heat dissipation bottle neck of the traditional heat dissipation base and accomplishes a complete illumination and complete heat dissipation in all angles at the same time, which greatly increases the efficiency of light illumination and heat dissipation capability. Especially, the present invention enables the LED member 10 to work in a relatively low temperature environment efficiently while greatly increase its heat dissipation ability, which further optimizes the conditions for the electrons and holes to provide a highly effective lighting effect through electroluminescence, hence producing a good working cycle of high heat dissipation efficiency-high lighting efficacy-high heat dissipation efficacy. The LED light source of the present invention is tested to provide a percentage of 85% or above for energy conversion from electric energy to light energy.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A LED light source, comprising one or more LED light source arrangements, wherein each of said LED light source arrangements comprises:

at least a LED member, wherein said LED member has a first light emitting surface and an opposed second light emitting surface, wherein said LED member is adapted for providing illumination through electroluminescence at both said first and second light emitting surfaces;

two fluorescent members on top of said first and second light emitting surfaces of said LED member respectively to retain said LED member in position such that the illumination generated from both said first and second light emitting surfaces of said LED member is capable of passing through said two fluorescent members from said first and second light emitting surfaces respectively; and an electrode member electrically coupled with said LED member for electrically connecting said LED member to a power source.

2. The LED light source, as recited in claim 1, wherein said LED member is securely sandwiched between said two fluorescent members to retain said LED member at a position that said first and second light emitting surfaces of said LED member are biased against said fluorescent members for supporting and directing heat transfer from said LED member while said LED member is retained within a LED receiving cavity at a gap between said fluorescent members.

3. The LED light source, as recited in claim 2, wherein said LED member has one of a flip-chip construction and a standard construction.

4. The LED light source, as recited in claim 3, wherein said LED member comprises p-type doping unit and a n-type doping unit located at one of said first and second light emitting surfaces to electrically link with said electrode member.

5. The LED light source, as recited in claim 4, further comprising a connecting element extending from said electrode member to said LED member to electrically link said LED member with said electrode member.

6. The LED light source, as recited in claim 4, further comprising an electric conductive layer provided and extended on at least one of said fluorescent members to electrically link said LED member with said electrode member.

7. The LED light source, as recited in claim 3, wherein said LED member comprises p-type doping unit and a n-type doping unit located at said first and second light emitting surfaces respectively to electrically link with said electrode member.

8. The LED light source, as recited in claim 7, further comprising a connecting element extending from said electrode member to said LED member to electrically link said LED member with said electrode member.

9. The LED light source, as recited in claim 7, further comprising an electric conductive layer provided and extended on each of said fluorescent members to electrically link said LED member with said electrode member.

10. The LED light source, as recited in claim 1, wherein said LED member has a current dispersion layer and an illuminative layer overlapped with said current dispersion layer in such a manner that a p-n junction is formed between said current dispersion layer and said illuminative layer at which the electroluminescence is occurred, such that the illumination is provided to said two fluorescent members through said two light emitting surfaces.

11. The LED light source, as recited in claim 4, wherein said LED member has a current dispersion layer and an illuminative layer overlapped with said current dispersion layer in such a manner that a p-n junction is formed between said current dispersion layer and said illuminative layer at which the electroluminescence is occurred, such that the illumination is provided to said two fluorescent members through said two light emitting surfaces.

12. The LED light source, as recited in claim 7, wherein said LED member has a current dispersion layer and an illuminative layer overlapped with said current dispersion layer in such a manner that a p-n junction is formed between said current dispersion layer and said illuminative layer at which the electroluminescence is occurred, such that the illumination is provided to said two fluorescent members through said two light emitting surfaces.

13. The LED light source, as recited in claim 10, wherein said LED member further comprise a base layer beneath said illuminative layer, wherein said base layer has a transparent and rigid structure positioned between said corresponding fluorescent member and said illuminative layer of said LED member, wherein said base layer is coupled to said corresponding fluorescent member through a bonding connection such that said LED member is further secured onto said corresponding fluorescent member through said base layer.

14. The LED light source, as recited in claim 11, wherein said LED member further comprise a base layer beneath said illuminative layer, wherein said base layer has a transparent and rigid structure positioned between said corresponding fluorescent member and said illuminative layer of said LED member, wherein said base layer is coupled to said corresponding fluorescent member through a bonding connection such that said LED member is further secured onto said corresponding fluorescent member through said base layer.

15. The LED light source, as recited in claim 12, wherein said LED member further comprise a base layer beneath said illuminative layer, wherein said base layer has a transparent and rigid structure positioned between said corresponding fluorescent member and said illuminative layer of said LED member, wherein said base layer is coupled to said corresponding fluorescent member through a bonding connection such that said LED member is further secured onto said corresponding fluorescent member through said base layer.

16. The LED light source, as recited in claim 13, wherein said base layer is selected from the group consisting of a sapphire layer bonded to said corresponding fluorescent member, and an integrated layer integrated with said corresponding fluorescent member.

17. The LED light source, as recited in claim 14, wherein said base layer is selected from the group consisting of a sapphire layer bonded to said corresponding fluorescent member, and an integrated layer integrated with said corresponding fluorescent member.

18. The LED light source, as recited in claim 15, wherein said base layer is selected from the group consisting of a sapphire layer bonded to said corresponding fluorescent member, and an integrated layer integrated with said corresponding fluorescent member.

19. The LED light source, as recited in claim 1, wherein one of said fluorescent members is a thin fluorescent layer coated on said LED member.

20. The LED light source, as recited in claim 1, wherein each of said LED light source arrangement further comprises a retention member coupling with peripheral edges of said fluorescent members to retain a distance therebetween so as to retain said LED member between said fluorescent members.

21. The LED light source, as recited in claim 20, wherein said retention member has a plurality of passage openings communicating said LED receiving cavity with outside for dissipating the heat from said LED member within said LED receiving cavity.

22. The LED light source, as recited in claim 21, wherein said retention member is selected from a group consisting of an edge holder coupling at two outer surfaces of said fluorescent members and a bonding member coupling at inner surfaces of said fluorescent members through bonding.

23. The LED light source, as recited in claim 1, further comprising a LED light bulb structure which comprises a shell body defining a shell cavity therewithin and having a filled gas inside said shell body, wherein said LED light source arrangement is supported within said shell cavity to form a LED light bulb.

24. The LED light source, as recited in claim 23, wherein said LED light bulb structure further comprises a light effect construction for supporting said LED light source arrangements within said shell cavity, wherein said light effect construction comprises a plurality of connectors extending radially within said shell cavity to couple with said LED light source arrangements respectively so as to position said LED light source arrangements at an optimized position inside said shell cavity of said shell body.

25. The LED light source, as recited in claim 23, wherein said LED light bulb structure further comprises a light reflective member spacedly extending along said LED light source arrangement for collecting and reflecting the light from said LED light source arrangement to a predetermined direction through the provision of said light reflective member.

26. The LED light source, as recited in claim 23, wherein said LED light bulb structure further comprises a heat guider structure coupled with said shell body externally for enhancing heat transfer through a surface area of said shell body, wherein said heat guider structure comprises a plurality of fin members radially and outwardly extended from a non-illuminative surface of said shell body such that said non-illuminative surface is arranged for providing additional heat dissipating effect.

27. A manufacturing method of a LED light source, comprising the steps of:
(a) providing at least a LED member which has a first light emitting surface and an opposed second light emitting surface, wherein said LED member is adapted for providing illumination through electroluminescence at both said first and second light emitting surfaces;
(b) retaining said LED member between two fluorescent members to form a LED light source arrangement such that the illumination generated from said LED member is capable of passing through both said fluorescent members from said both said first and second light emitting surfaces respectively; and
(c) electrically coupling an electrode member with said LED member for electrically connecting said LED member to a power source.

28. The method, as recited in claim 27, wherein the step (b) further comprises a step of securely sandwiching said LED member between said two fluorescent members to retain said LED member at a position that said first and second light emitting surfaces of said LED member are biased against said fluorescent members directly for support and direct heat transfer from said LED while said LED member is retained within a LED receiving cavity at a gap between said fluorescent members.

29. The method, as recited in claim 28, wherein the step (a) further comprises the steps of:
(a.1) overlapping a first current dispersion layer with a second illuminative layer; and
(a.2) forming said LED member through doping said LED member to form a p-type doping unit on said current dispersion layer and a n-type doping unit on said illuminative layer such that a p-n junction is defined between said current dispersion layer and said illuminative layer at which electroluminescence is arranged to occurred.

30. The method, as recited in claim 29, wherein the step (a) further comprises a step (a.3) of bonding a third base layer to said illuminative layer, wherein said base layer has a transparent and rigid structure positioned between said corresponding fluorescent member and said illuminative layer of said LED member.

31. The method, as recited in claim 30, wherein said base layer is selected from the group consisting of a sapphire layer bonded to said corresponding fluorescent member, and an integrated layer integrated with said corresponding fluorescent member.

32. The method, as recited in claim 27, wherein the step (c) further comprises a step of extending a connecting element from said electrode member to said LED member to electrically link said LED member with said electrode member.

33. The method, as recited in claim 27, wherein the step (c) further comprises a step of providing and extending an electric conductive layer on at least one of said fluorescent members to electrically link said LED member with said electrode member.

34. The method, as recited in claim 27, wherein one of said fluorescent members is a thin fluorescent layer coated on said LED member.

35. The method, as recited in claim 27, further comprising a step of supporting said LED light source arrangement within a shell cavity of a shell body to form a LED light bulb structure and filling a filled gas within said shell cavity that said filled gas is served as a medium for heat transfer to guide the heat generated from said LED light source arrangement to reach said shell body.

36. The method, as recited in claim 27, further comprising a step (d) of coupling a retention member with peripheral edges of said fluorescent members to retain a distance therebetween so as to retain said LED member between said fluorescent members.

37. The method, as recited in claim 36, wherein the step (d) further comprises a step of forming a plurality of passage openings at said retention member for communicating said LED receiving cavity with outside so as to dissipate the heat from said LED member within said LED receiving cavity.

* * * * *